US010147362B2

(12) United States Patent
Yang

(10) Patent No.: US 10,147,362 B2
(45) Date of Patent: Dec. 4, 2018

(54) PIXEL CIRCUIT AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Shengji Yang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/777,942

(22) PCT Filed: Oct. 29, 2014

(86) PCT No.: PCT/CN2014/089763
§ 371 (c)(1),
(2) Date: Sep. 17, 2015

(87) PCT Pub. No.: WO2016/008232
PCT Pub. Date: Jan. 21, 2016

(65) Prior Publication Data

US 2016/0163267 A1 Jun. 9, 2016

(30) Foreign Application Priority Data

Jul. 17, 2014 (CN) .......................... 2014 1 0342198

(51) Int. Cl.
*G09G 3/32* (2016.01)
*G09G 5/02* (2006.01)
(Continued)

(52) U.S. Cl.
CPC ......... *G09G 3/3291* (2013.01); *G09G 3/3233* (2013.01); *G09G 3/3266* (2013.01);
(Continued)

(58) Field of Classification Search
CPC ......... G06F 3/041; G09G 3/3233; G09G 5/02
See application file for complete search history.

(56) References Cited

U.S. PATENT DOCUMENTS 7,327,357 B2 * 2/2008 Jeong .................. G09G 3/3233 315/169.1
7,502,001 B2 * 3/2009 Fish ..................... G09G 3/3233 345/207

(Continued)

FOREIGN PATENT DOCUMENTS

CN 1499470 A 5/2004
CN 1741109 A 3/2006

(Continued)

OTHER PUBLICATIONS

Search Report and Written Opinion dated Apr. 27, 2015 from State Intellectual Property Office of the P.R. China.

(Continued)

*Primary Examiner* — Lin Li
(74) *Attorney, Agent, or Firm* — Dilworth & Barrese, LLP.; Michael J. Musella, Esq.

(57) ABSTRACT

A pixel circuit and a display apparatus. The pixel circuit comprises three sub-pixel circuits and one power supply circuit, wherein the three sub-pixel circuits share a data line; the power supply circuit is connected to a first voltage level terminal, a first signal control line and the sub-pixel circuits, and the power supply circuit is configured to supply a first voltage level to the sub-pixel circuits through the first voltage level terminal under the control of a signal of the first signal control line; and the sub-pixel circuits are con-
(Continued)

nected to the power supply circuit and the data line), and are configured to display a gray scale under the control of the first voltage level supplied by the power supply circuit and a data signal of the data line.

7 Claims, 27 Drawing Sheets

(51) Int. Cl.

| | |
|---|---|
| ***H05B 33/08*** | (2006.01) |
| ***H01L 27/15*** | (2006.01) |
| ***G09G 3/3291*** | (2016.01) |
| ***G09G 3/3233*** | (2016.01) |
| ***G09G 3/3266*** | (2016.01) |

(52) U.S. Cl.
CPC ............... *G09G 2300/0804* (2013.01); *G09G 2300/0809* (2013.01); *G09G 2300/0814* (2013.01); *G09G 2300/0819* (2013.01); *G09G 2300/0852* (2013.01); *G09G 2300/0861* (2013.01); *G09G 2310/027* (2013.01); *G09G 2310/0251* (2013.01); *G09G 2310/0262* (2013.01); *G09G 2310/0289* (2013.01); *G09G 2310/08* (2013.01); *G09G 2320/0233* (2013.01); *G09G 2320/043* (2013.01)

(56) References Cited

U.S. PATENT DOCUMENTS

| | | | | | |
|---|---|---|---|---|---|
| 2006/0221662 | A1 | 10/2006 | Park et al. | | |
| 2006/0267885 | A1* | 11/2006 | Kwak | G09G 3/3233 | 345/76 |
| 2007/0120795 | A1* | 5/2007 | Uchino | G09G 3/3233 | 345/92 |
| 2008/0316150 | A1* | 12/2008 | Lee | G09G 3/3233 | 345/76 |
| 2012/0105387 | A1* | 5/2012 | Choi | G09G 3/3225 | 345/204 |
| 2013/0009933 | A1* | 1/2013 | Toyomura | G09G 3/3225 | 345/211 |
| 2013/0278582 | A1* | 10/2013 | Liao | G09G 5/02 | 345/212 |
| 2014/0054624 | A1* | 2/2014 | Chen | H01L 27/156 | 257/89 |
| 2014/0168180 | A1* | 6/2014 | Kim | H05B 33/0896 | 345/205 |
| 2014/0353608 | A1* | 12/2014 | Kim | G09G 3/3233 | 257/40 |
| 2014/0353616 | A1* | 12/2014 | Park | G09G 3/3208 | 257/40 |
| 2014/0362062 | A1* | 12/2014 | Limketkai | G09G 3/3233 | 345/205 |
| 2015/0317952 | A1* | 11/2015 | Ohara | G09G 3/3233 | 345/213 |

FOREIGN PATENT DOCUMENTS

| | | | |
|---|---|---|---|
| CN | 101329836 | A | 12/2008 |
| CN | 102176303 | A | 9/2011 |
| CN | 102982766 | A | 3/2013 |
| CN | 103218972 | A | 7/2013 |
| CN | 103927978 | A | 7/2014 |
| CN | 203689881 | U | 7/2014 |
| JP | 2006309155 | A | 11/2006 |

OTHER PUBLICATIONS

First Office Action issued by the Chinese Patent Office in the priority Chinese Application No. 2014103421981 dated Dec. 3, 2015.

* cited by examiner

PIXEL CIRCUIT AND DISPLAY APPARATUS

TECHNICAL FIELD OF THE DISCLOSURE

The present disclosure relates to a pixel circuit and a display apparatus.

BACKGROUND

OLED (Organic Light-Emitting Diode) displays are one of current hot spots in the research area of the flat panel display. Compared with liquid crystal (LC) displays, the OLED displays have advantages such as low power consumption, low production cost, self-illumination, wide angle of view, fast response, and so on. Currently, the OLED displays have begun to replace traditional LC displays (LCDs) in the display areas such as cell phones, personal digital assistants (PDAs), digital cameras, etc. The design of pixel driving circuits is a core technology of the OLED displays, and thus has significant research value.

Different from the thin film transistor (TFT)-LCDs (TFT-LCDs) which use a stable voltage to control the brightness, the OLED displays are current-driven, which need a stable current to control the light emitting.

Normally, one pixel circuit is usually corresponding to one sub-pixel, and each pixel circuit comprises at least one data line, one voltage line providing an operating voltage, and a plurality of scan signal lines. As a result, the corresponding fabrication process would be complicated, and the pixel pitch is hard to be reduced.

SUMMARY

At least one embodiment of the present disclosure decreases the number of signal lines for pixel circuits in a display apparatus, reduces the cost of the integrated circuit, and in the meanwhile improves the pixel density of the display apparatus.

According to one aspect of the present disclosure, there is provided a pixel circuit comprising three sub-pixel circuits and one power supply circuit, wherein the three sub-pixel circuits share a data line;

the power supply circuit is connected to a first voltage level terminal, a first signal control line and the sub-pixel circuits, the power supply circuit is configured to supply a first voltage level to the sub-pixel circuits through the first voltage level terminal under the control of a signal of the first signal control line; and the sub-pixel circuits are connected to the power supply circuit and the data line, and configured to display a gray scale under the control of the first voltage level supplied by the power supply circuit and a data signal of the data line.

Optionally, the power supply circuit comprises a first switch unit whose control terminal is connected to the first signal control line, whose first terminal is connected to the first voltage level terminal, and whose second terminal is connected to the three sub-pixel circuits, and the first switch unit is configured to supply the first voltage level of the first voltage level terminal to the three sub-pixel circuits under the control of a signal of the first signal control line.

Optionally, the power supply circuit comprises a first switch unit, a second switch unit and a third switch unit;

a control terminal of the first switch unit is connected to the first signal control line, a first terminal of the first switch unit is connected to the first voltage level terminal and a second terminal of the first switch unit is connected to a first sub-pixel circuit among the three sub-pixel circuits, and the first switch unit is configured to supply the first voltage level of the first voltage level terminal to the first sub-pixel circuit under the control of a signal of the first signal control line;

a control terminal of the second switch unit is connected to the first signal control line, a first terminal of the second switch unit is connected to the first voltage level terminal, a second terminal of the second switch unit is connected to a second sub-pixel circuit among the three sub-pixel circuits, and the second switch unit is configured to supply the first voltage level of the first voltage level terminal to the second sub-pixel circuit under the control of a signal of the first signal control line; and a control terminal of the third switch unit is connected to the first signal control line, a first terminal of the third switch unit is connected to the first voltage level terminal, a second terminal of the third switch unit is connected to a third sub-pixel circuit among the three sub-pixel circuits, and the third switch unit is configured to supply the first voltage level of the first voltage level terminal to the third sub-pixel circuit under the control of a signal of the first signal control line.

Optionally, each of the sub-pixel circuits comprises four switch units which are fourth to seventh switch units respectively, a driving unit, an energy storage unit and an electroluminescent unit;

a control terminal of the fourth switch unit is input with a first scan signal, a first terminal of the fourth switch unit is connected to a second voltage level terminal, a second terminal of the fourth switch unit is connected to a first electrode of the energy storage unit, and the fourth switch unit is configured to write a signal of the second voltage level terminal into the first electrode of the energy storage unit under the control of the first scan signal;

a control terminal of the fifth switch unit is input with a third scan signal, a first terminal of the fifth switch unit is connected to the data line, and the fifth switch unit is configured to output a signal of the data line at a second terminal of the fifth switch unit under the control of the third scan signal;

a control terminal of the sixth switch unit is input with a second scan signal, a first terminal of the sixth switch unit is connected to the first electrode of the energy storage unit, a second terminal of the sixth switch unit is connected to the second terminal of the fifth switch unit, and the sixth switch unit is configured to write the signal of the data line into the first electrode of the energy storage unit under the control of the second scan signal to couplingly raise the voltage level of a second electrode of the energy storage unit;

a control terminal of the driving unit is connected to the second terminal of the sixth switch unit, an input terminal of the driving unit is connected to the second electrode of the energy storage unit, and the driving unit is configured to output a driving current;

a control terminal of the seventh switch unit is input with a fourth scan signal, a first terminal of the seventh switch unit is connected to an output terminal of the driving unit, a second terminal of the seventh switch unit is connected to the second voltage level terminal, and the seventh switch unit is configured to control the driving current to be input into a first electrode of the electroluminescent unit under the control of the fourth scan signal;

the first electrode of the electroluminescent unit is connected to the output terminal of the driving unit, a second electrode of the electroluminescent unit is connected to the second voltage level terminal, and the electroluminescent unit is configured to display the gray scale under the control of the driving current; and the second electrode of the energy storage unit is connected to the power supply circuit, and the energy storage unit is configured to store the signal of the data line and a threshold voltage of the driving unit.

Optionally, among the three sub-pixel circuits, the first sub-pixel circuit, the second sub-pixel circuit and the third sub-pixel circuit share one first scan line to input the first scan signal into the control terminal of the fourth switch unit.

Optionally, the control terminal of the fifth switch unit of the first sub-pixel circuit is connected to the first scan line, the first scan signal and the third scan signal of the first sub-pixel circuit have the same time sequence.

Optionally, among the three sub-pixel circuits, the first sub-pixel circuit, the second sub-pixel circuit and the third sub-pixel circuit share one second scan line to input a second scan signal into the control terminal of the sixth switch unit and a fourth scan signal into the control terminal of the seventh switch unit respectively, and the second scan signal and the fourth scan signal have the same time sequence.

Optionally, among the three sub-pixel circuits, the control terminal of the fifth switch unit of the third sub-pixel circuit is connected to the second scan line, the third scan signal input into the control terminal of the fifth switch unit and the second scan signal input into the control terminal of the sixth switch unit in the third sub-pixel circuit have the same time sequence.

Optionally, the sub-pixel circuits are further connected to a second signal control line and the first voltage level terminal, and each of the sub-pixel circuits comprises four switch units which are eighth to eleventh switch units respectively, a driving unit, an energy storage unit and an electroluminescent unit;

a first electrode of the energy storage is connected of the first voltage level terminal, and the energy storage is configured to write the first voltage level of the first voltage level terminal into the first electrode of the energy storage unit;

a control terminal of the eighth switch unit is connected to the second signal control line, a first terminal of the eighth switch unit is connected to a second electrode of the energy storage unit, a second terminal of the eighth switch unit is connected to a second voltage level terminal, and the eighth switch unit is configured to write a second voltage level of the second voltage level terminal into the second electrode of the energy storage unit under the control of a signal of the second signal control line;

a control terminal of the ninth switch unit is input with a second scan signal, a first terminal of the ninth switch unit is connected to the data line, a second terminal of the ninth switch unit is connected to an output terminal of the driving unit, and the ninth switch unit is configured to write a signal of the data line into the output terminal of the driving unit under the control of the second scan signal:

a control terminal of the tenth switch unit is input with a first scan signal, a first terminal of the tenth switch unit is connected to the second electrode of the energy storage unit, a second terminal of the tenth switch unit is connected to an input terminal of the driving unit and the power supply circuit, and the tenth switch unit is configured to write the signal of the data line and a threshold voltage of the driving unit into the second electrode of the energy storage unit;

a control terminal of the driving unit is connected to the first terminal of the tenth switch unit, and the driving unit is configured to output a driving current at the output terminal;

a control terminal of the eleventh switch unit is connected to the first signal control line, a first terminal of the eleventh switch unit is connected to the output terminal of the driving unit, and the eleventh switch unit is configured to control the driving current to be input into a first electrode of the electroluminescent unit under the control of the signal of the first signal control line; and the first electrode of the electroluminescent unit is connected to the second terminal of the eleventh switch unit, a second electrode of the electroluminescent unit is connected to the second voltage level terminal, and the electroluminescent unit is configured to display the gray scale under the control of the driving current.

Optionally, in the same one of the sub-pixel circuits, the control terminal of the ninth switch unit and the control terminal of the tenth switch unit share one scan line to make the first scan signal and the second scan signal have the same time sequence.

Optionally, the sub-pixel circuits are further connected to a second signal control line and a third signal control line, and each of the sub-pixel circuits comprises four switch units which are twelfth to fifteenth switch units respectively, a driving unit, an energy storage unit and an electroluminescent unit;

a control terminal of the twelfth switch unit is input with a first scan signal, a first terminal of the twelfth switch unit is connected to the data line, a second terminal of the twelfth switch unit is connected to a first electrode of the energy storage unit, and the twelfth switch unit is configured to write a signal of the data line into the first electrode of the energy storage unit under the control of the first scan signal;

a control terminal of the thirteenth switch unit is connected to the second signal control line, a first terminal of the thirteenth switch unit is connected to the second terminal of the twelfth switch unit, a second terminal of the thirteenth switch unit is connected to a second voltage level terminal, and the thirteenth switch unit is configured to write a second voltage level of the second voltage level terminal into the first electrode of the energy storage unit under the control of a signal of the second signal control line;

a control terminal of the fourteenth switch unit is connected to the second signal control line, a first terminal of the fourteenth switch unit is connected to a second electrode of the energy storage unit, a second terminal of the fourteenth switch unit is connected to an output terminal of the driving unit, and the fourteenth switch unit is configured to write the first voltage level and a threshold voltage of the driving unit into the second electrode of the energy storage unit under the control of the second signal control line;

an input terminal of the driving unit is connected to the power supply circuit, a control terminal of the driving unit is connected to the second electrode of the energy storage unit, the output terminal of the driving unit is connected to the second terminal of the fourteenth switch unit, and the driving unit is configured to output a driving current at the output terminal;

a control terminal of the fifteenth switch unit is connected to the third signal control line, a first terminal of the fifteenth switch unit is connected to the output terminal of the driving unit, and the fifteenth switch unit is configured to control the driving current to be input into a first electrode of the electroluminescent unit under the control of the third signal control line;

the first electrode of the elcctroluminesccnt unit is connected to a second terminal of the fifteenth switch unit, a second electrode of the electroluminescent unit is connected to the second voltage level terminal, and the electroluminescent unit is configured to display the gray scale under the control of the driving current.

Optionally, the switch units and the driving unit are thin film transistors (TFTs), the control terminal of each switch unit is a gate of a TFT, the first terminal of the each switch unit is a source of a TFT, the second terminal of each switch unit is a drain of a TFT, the input terminal of the driving unit is a source of a TFT, the control terminal of the driving unit is a gate of a TFT, and the output terminal of the driving unit is a drain of a TFT.

Optionally, the energy storage unit is a capacitor.

Optionally, the electroluminescent unit is an organic light emitting diode.

According to one aspect of the present disclosure, there is provided a display apparatus comprising any of the above pixel circuits.

Optionally, the three sub-pixel circuits of the pixel circuit are located within the same pixel.

Optionally, the three sub-pixel circuits are located on the same side of the data line.

Optionally, the three sub-pixel circuits of the pixel circuit are located within two adjacent pixels, a first sub-pixel circuit and a second sub-pixel circuit which are adjacent among the three sub-pixel circuits are located within a first pixel, and a third sub-pixel circuit is located within a second pixel; or a first sub-pixel circuit among the three sub-pixel circuits is located within a first pixel, and a second sub-pixel circuit and a third sub-pixel circuit which are adjacent are located within a second pixel, wherein, the first pixel is adjacent to the second pixel.

Optionally, the data line is located between the first pixel and the second pixel.

In the pixel circuit and the display apparatus provided by at least one embodiment of the present disclosure, three adjacent sub-pixel circuits share one data line, and one first voltage level terminal is configured to supply operating voltages to the three sub-pixel circuits. Therefore, it is possible to decrease the number of the signal lines used in the pixel circuit in the display apparatus, reduce the cost of the integrated circuit, and in the meanwhile improve the pixel density of the display apparatus.

BRIEF DESCRIPTION OF THE DRAWINGS

In the following, figures used in embodiments are introduced briefly.

DETAILED DESCRIPTION

In the following, technical solutions in embodiments of the present disclosure will be clearly and completely described in connection with figures. Obviously, the described embodiments are only part of embodiments of the present disclosure, rather than all the embodiments. Based on the embodiments in the present disclosure, all other embodiments obtained by those skilled in the art without creative work all belong to the protection scope of the present disclosure.

The switch transistors and the driving transistors adopted by all embodiments of the present disclosure can be TFTs or field effect transistors (FETs) or other devices with the same characteristics. Since the source and the drain of the switch transistor used herein are symmetric, the source and drain are exchangeable. In embodiments of the present disclosure, in order to distinguish the two terminals other than the gate, one of the two terminals is referred to as a source, and the other is referred to as a drain. According to the form in the figures, it is defined that the middle terminal of the transistor is the gate, the signal input terminal is the source, and the signal output terminal is the drain. In addition, the switch transistors used in embodiments of the present disclosure involve two types, which are P type switch transistors and N type switch transistors, wherein the P type switch transistor is turned on when the gate is at a low voltage level and turned off when the gate is at a high voltage level; the N type switch transistor is turned on when the gate is at a high voltage level and turned off when the gate is at a low voltage level. The driving transistors involves a P type and a N type, wherein the P type driving transistor is in an amplification state or a saturation state when the gate voltage is at a low voltage level (the gate voltage is lower than the source voltage) and the absolute value of the voltage difference between the gate and the source is higher than a threshold voltage; the N type driving transistor is in the amplification state or the saturation state when the gate voltage is at a high voltage level (the gate voltage is higher than the source voltage) and the absolute value of the voltage difference between the gate and the source is higher than a threshold voltage.

Figure 1:
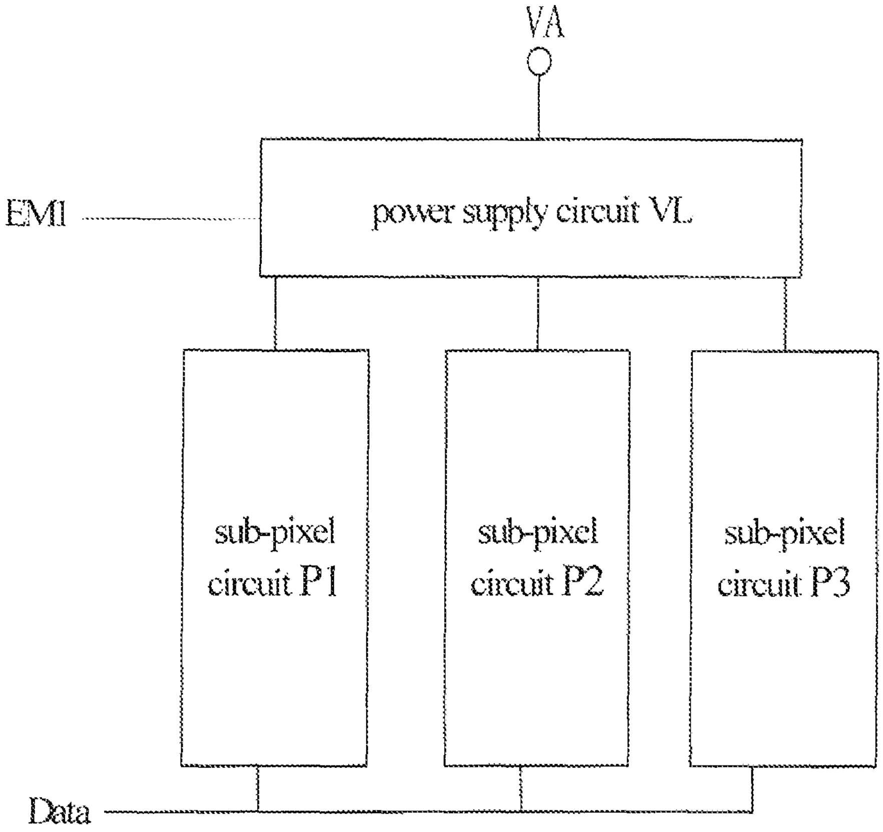
FIG. 1 is a block diagram of a pixel circuit provided by an embodiment of the present disclosure.

FIG. 1 is a block diagram of a pixel circuit provided by an embodiment of the present disclosure. As shown in FIG. 1, the pixel circuit comprises three sub-pixel circuits P1, P2 and P3, and one power supply circuit VL, wherein the three sub-pixel circuits share a data line Data.

The power supply circuit VL is connected to a first voltage level terminal VA, a first signal control line EM1 and the sub-pixel circuits P1, P2 and P3, the power supply circuit VL is configured to supply a first voltage level to the sub-pixel circuits P1, P2 and P3 through the first voltage level terminal VA under the control of a signal of the first signal control line EM1.

The sub-pixel circuits P1, P2 and P3 are connected to the power supply circuit VL and the data line Data, and are configured to display a gray scale under the control of the first voltage level supplied by the power supply circuit VL and a data signal of the data line Data.

In the pixel circuit provided by an embodiment of the present disclosure, three adjacent sub-pixel circuits share one data line, and one first voltage level terminal is configured to supply operating voltages to the three sub-pixel circuits. Therefore, it is possible to decrease the number of the signal lines used in the pixel circuit in the display apparatus, reduce the cost of the integrated circuit, and improve the pixel density of the display apparatus.

First Embodiment

Figure 2:
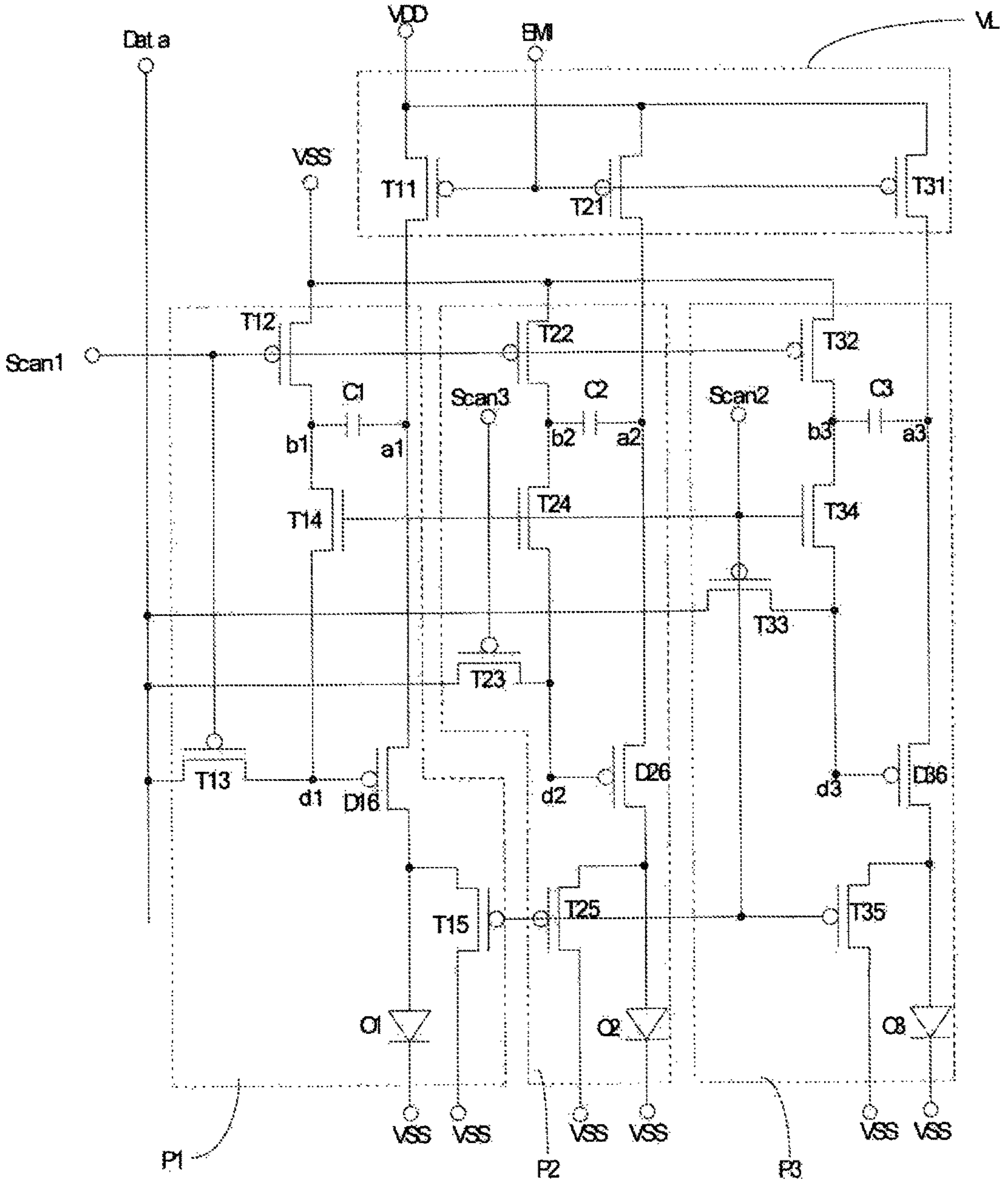
FIG. 2 is a schematic diagram of a structure of a pixel circuit provided by another embodiment of the present disclosure.

FIG. 2 is a schematic diagram of a structure of a pixel circuit provided by another embodiment of the present disclosure. Referring to FIG. 2, the pixel circuit comprises three sub-pixel circuits P1, P2 and P3, and one power supply circuit VL, wherein the three sub-pixel circuits share a data line Data.

The power supply circuit comprises a first switch unit T11, a second switch unit T21 and a third switch unit T31.

A control terminal of the first switch unit T11 is connected to the first signal control line EM1, a first terminal of the first switch unit T11 is connected to the first voltage level terminal VA, and a second terminal of the first switch unit T11 is connected to a first sub-pixel circuit P1 among the three sub-pixel circuits, and the first switch unit T11 is configured to supply the first voltage level of the first voltage level terminal VA to the first sub-pixel circuit P1 under the control of a signal of the first signal control line EM1.

A control terminal of the second switch unit T21 is connected to the first signal control line EM1, a first terminal of the second switch unit T21 is connected to the first voltage level terminal VA, a second terminal of the second switch unit T21 is connected to a second sub-pixel circuit P2 among the three sub-pixel circuits, and the second switch unit T21 is configured to supply the first voltage level of the first voltage level terminal VA to the second sub-pixel circuit P2 under the control of a signal of the first signal control line EM1.

A control terminal of the third switch unit T31 is connected to the first signal control line EM1, a first terminal of the third switch unit T31 is connected to the first voltage level terminal VA, a second terminal of the third switch unit T31 is connected to a third sub-pixel circuit P3 among the three sub-pixel circuits, and the third switch unit T31 is configured to supply the first voltage level of the first voltage level terminal VA to the third sub-pixel circuit P3 under the control of a signal of the first signal control line EM1.

Further, each of the sub-pixel circuits P1, P2 and P3 comprises four switch units, a driving unit, an energy storage unit and an electroluminescent unit. In order to distinguish those units, in P1, the four switch units comprised are a fourth switch unit T12, a fifth switch unit T13, a sixth switch unit T14, and a seventh switch unit T15 in turn, the driving unit is D16, the energy storage unit is C1, the electroluminescent unit is O1; in P2, the four switch units comprised are a fourth switch unit T22, a fifth switch unit T23, a sixth switch unit T24, and a seventh switch unit T25 in turn, the driving unit is D26, the energy storage unit is C2, the electroluminescent unit is O2; in P3, the four switch units comprised are a fourth switch unit T32, a fifth switch unit T33, a sixth switch unit T34, and a seventh switch unit T35 in turn, the driving unit is D36, the energy storage unit is C3, the electroluminescent unit is O3.

In the following, description is made by taking the connection relationship of devices in P1 as an example only. The connection relationship of devices in P2 and P3 refers to P1, which will not be repeatedly herein.

A control terminal of the fourth switch unit T12 is input with a first scan signal S1, a first terminal of the fourth switch unit T12 is connected to a second voltage level terminal VB, a second terminal of the fourth switch unit T12 is connected to a first electrode of the energy storage unit C1, and the fourth switch unit T12 is configured to write a signal of the second voltage level terminal VB into the first electrode of the energy storage unit C1 under the control of the first scan signal S1.

A control terminal of the fifth switch unit T13 is input with a third scan signal S3, a first terminal of the fifth switch unit T13 is connected to the data line Data, and the fifth switch unit T13 is configured to output a signal of the data line Data at a second terminal of the fifth switch unit T13 under the control of the third scan signal S3.

A control terminal of the sixth switch unit T14 is input with a second scan signal S2, a first terminal of the sixth switch unit T14 is connected to the first electrode of the energy storage unit C1, a second terminal of the sixth switch unit T14 is connected to the second terminal of the fifth switch unit T13, and the sixth switch unit T14 is configured to write the signal of the data line Data into the first electrode of the energy storage unit C1 under the control of the second scan signal S2 to couplingly raise the voltage level of a second electrode of the energy storage unit C1.

A control terminal of the driving unit D16 is connected to the second terminal of the sixth switch unit T14, an input terminal of the driving unit D16 is connected to the second electrode of the energy storage unit C1, and the driving unit D16 is configured to output a driving current.

A control terminal of the seventh switch unit T15 is input with a fourth scan signal S4, a first terminal of the seventh switch unit T15 is connected to an output terminal of the driving unit D16, a second terminal of the seventh switch unit T15 is connected to the second voltage level terminal VB, and the seventh switch unit T15 is configured to control the driving current to be input into a first electrode of the electroluminescent unit O1 under the control of the fourth scan signal S4.

The first electrode of the electroluminescent unit O1 is connected to the output terminal of the driving unit D16, a second electrode of the electroluminescent unit O1 is connected to the second voltage level terminal VB, and the electroluminescent unit O1 is configured to display the gray scale under the control of the driving current.

The second electrode of the energy storage unit C1 is connected to the power supply circuit VL, and the energy storage unit C1 is configured to store the signal of the data line Data and a threshold voltage of the driving unit D16.

Optionally, among the three sub-pixel circuits, the first sub-pixel circuit P1, the second sub-pixel circuit P2 and the third sub-pixel circuit P3 share one first scan line Scan1 to input the first scan signal S1 into the control terminal of the fourth switch unit (T12, T22 and T32). Since it is possible to reduce the number of signal lines of the pixel circuit to some extent due to the fact that the three sub-pixel units share one scan line, the cost of the integrated circuit can be reduced.

Further, the control terminal of the fifth switch unit T13 of the first sub-pixel circuit P1 is connected to the first scan line Scan1, the first scan signal S1 and the third scan signal S3 of the first sub-pixel circuit P1 have the same time sequence. Since it is possible to reduce the number of signal lines of the pixel circuit by sharing the first scan line Scan1, the cost of the integrated circuit can be reduced.

Optionally, among the three sub-pixel circuits, the first sub-pixel circuit P1, the second sub-pixel circuit P2 and the third sub-pixel circuit P3 share one second scan line Scan2 to input a second scan signal S2 into the control terminal of the sixth switch unit (T14, T24 and T34) and a fourth scan signal S4 into the control terminal of the seventh switch unit (T15, T25 and T35) respectively, and the second scan signal S2 and the fourth scan signal S4 have the same time sequence. Since it is possible to reduce the number of signal lines of the pixel circuit to some extent due to the fact that the three sub-pixel units share one scan line, the cost of the integrated circuit can be reduced.

Among the three sub-pixel circuits, the control terminal of the fifth switch unit T33 of the third sub-pixel circuit P3 is connected to the second scan line Scan2. Since the second scan line Scan2 is connected to both the control terminals of the T33 and T34, the third scan signal S3 input into the control terminal of the fifth switch unit T33 and the second scan signal S2 input into the control terminal of the sixth switch unit T34 in the third sub-pixel circuit P3 have the same time sequence. Since it is possible to reduce the number of signal lines of the pixel circuit by sharing the second scan line Scan2, the cost of the integrated circuit can be reduced.

The control terminal of the fifth switch unit T23 of the second sub-pixel circuit P2 is connected to the third scan line Scan3.

For example, the first voltage level is a high voltage level VDD, and the second voltage level is a low voltage level VSS provided by being grounded.

Figure 3:
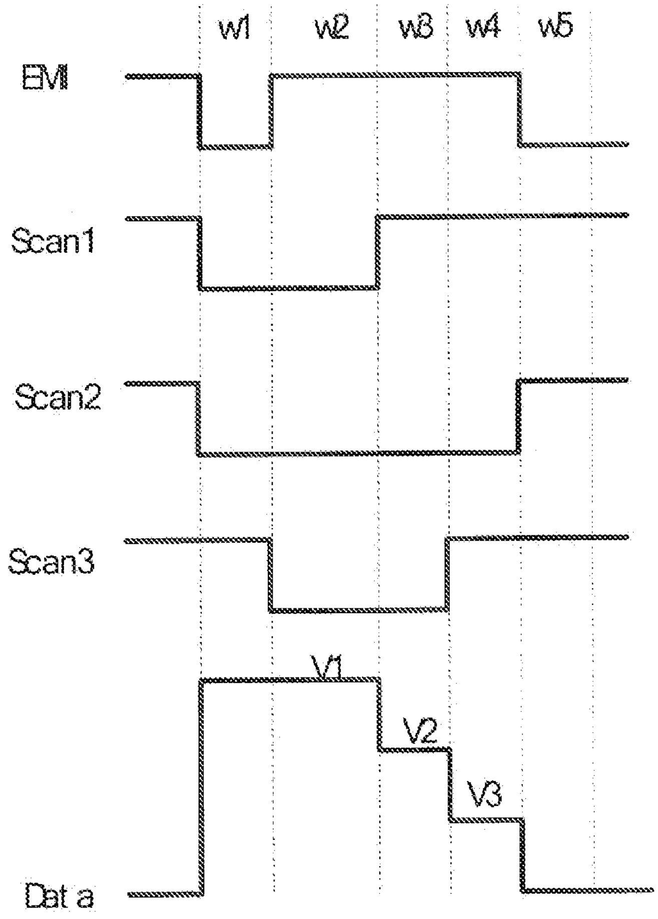
FIG. 3 is a diagram of a time sequence of key signals in the pixel circuit as provided in FIG. 2 of the present disclosure.

FIG. 3 is a diagram of a time sequence of key signals in the pixel circuit as provided in FIG. 2 of the present disclosure. FIGS. 4-8 are schematic diagrams of flow direction of current at phases w1, w2, w3, w4, w5 in the pixel circuit as provided in FIG. 2 of the present disclosure respectively. In the following, description is made on the operating principle of the pixel circuit provided by FIG. 2 with an example that the first voltage level is VDD and the second voltage level is VSS, in connection with the signal time sequence diagram shown in FIG. 3 and the schematic diagrams of flow direction in FIGS. 4-8. Description is made with an example that the switch units are thin film transistors (simply referred to as switch transistors or TFTs), the driving units are driving-type thin film transistors (simply referred to as driving transistors or DTFTs), the energy storage units are capacitors, and the electroluminescent units are organic light emitting diodes (OLEDs). FIG. 2 also shows the first scan line Scan1, the second scan line Scan2 and the third scan line Scan3, wherein the third scan line Scan3 is configured to provide the third scan signal S3 to T23 in P2. Description is made by an example that the switch transistors T14, T24, T34 are N type switch transistors, and the other switch transistors are P type switch transistors. The signal time sequence diagram shown in FIG. 3 can be divided into five phases, which are represented as a reset phase w1, a first discharge phase w2, a second discharge phase w3, a third discharge phase w4, and a light emitting phase w5, respectively.

Figure 4:
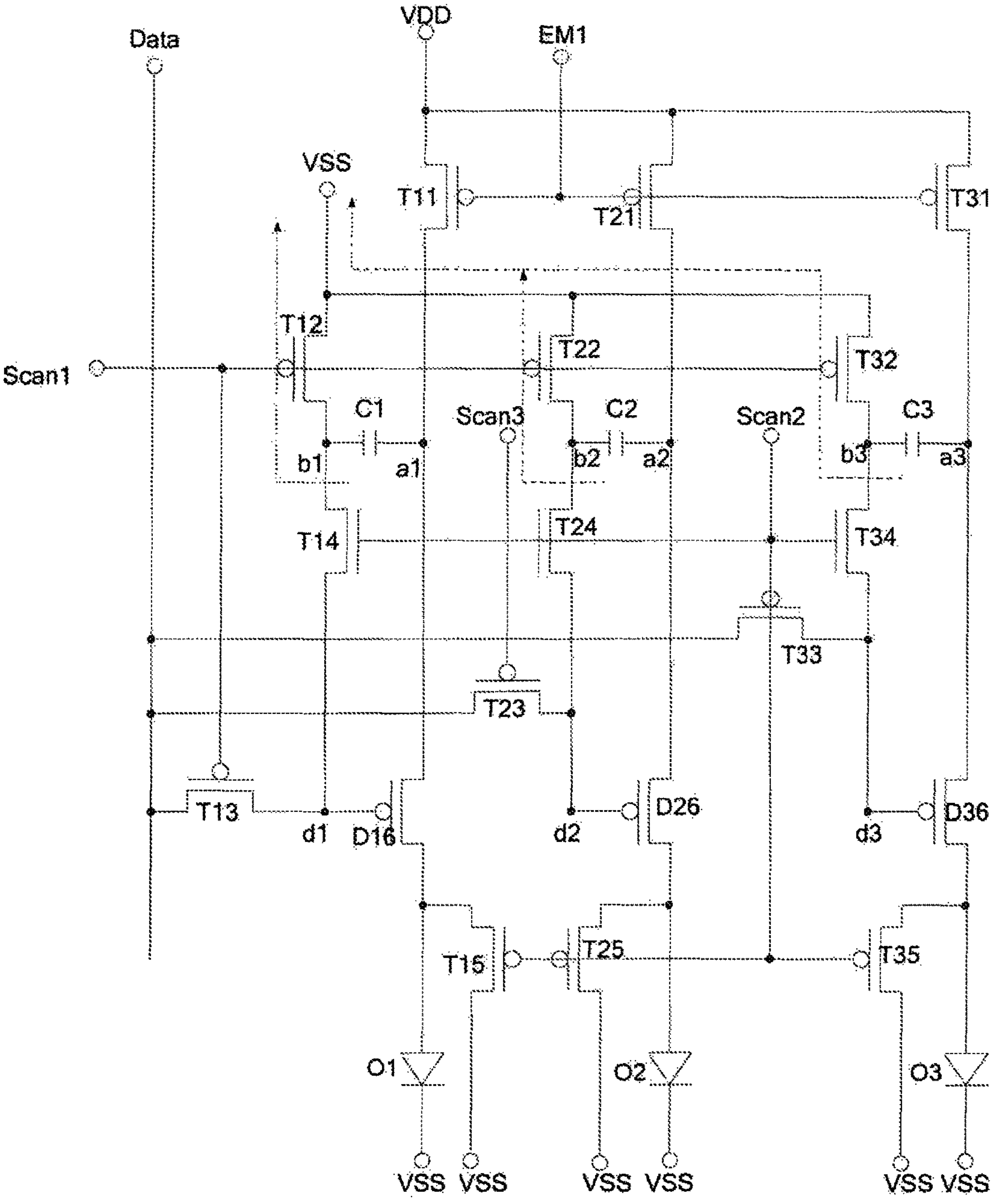
FIG. 4 is a schematic diagram of flow direction of current at phase w1 in the pixel circuit as provided in FIG. 2 of the present disclosure.

At the reset phase w1, the signals on Scan1, Scan2 and EM1 are all at low voltage levels. All TFTs other than T14, T24, T34 and T23 are turned on while T14, T24, T34 and T23 are turned off. The first electrode b1 of the capacitor C1, the first electrode b2 of the capacitor C2, and the first electrode b3 of C3 are grounded simultaneously, and the three have a potential of 0V; the second electrodes a1, a2 and a3 are input with a high voltage VDD. Since T13 and T33 are turned on, the gate d1 of D16 and the gate d3 of D36 are input with the signal Vdata of the data line whose potential is V1. Referring to FIG. 4, it is shown the schematic diagram of current direction at phase w1.

Figure 5:
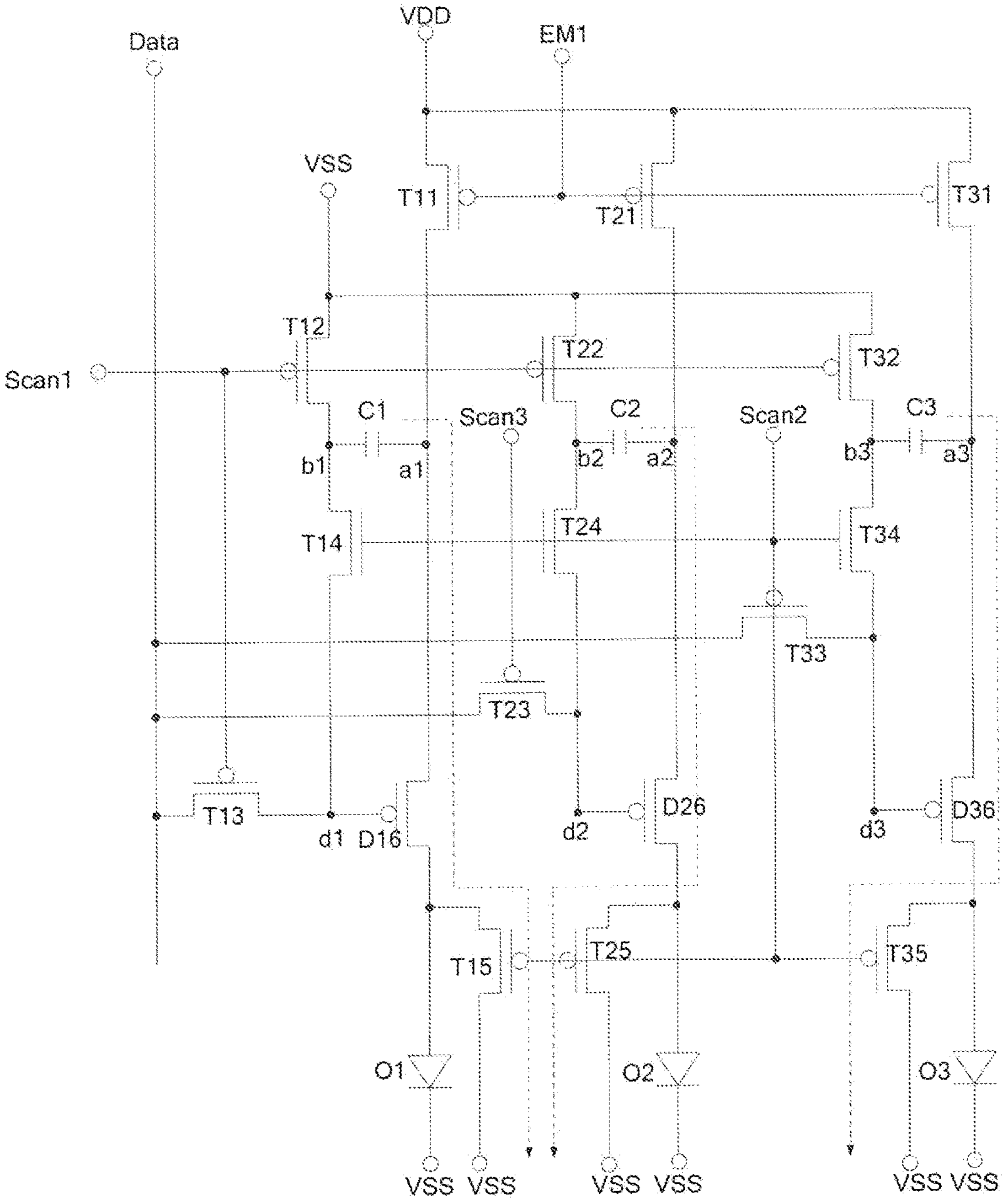
FIG. 5 is a schematic diagram of flow direction of current at phase w2 in the pixel circuit as provided in FIG. 2 of the present disclosure.

At the first discharge phase w2, Scan1, Scan2 and Scan3 are all at the low voltage level, and EM1 is at a high voltage level. The TFTs T12, T22, T32, T13, T23, T33, T15, T25 and T35 are turned on, and the other TFTs are turned off. The capacitors C1, C2 and C3 are discharged. FIG. 5 shows the discharge paths of C1, C2 and C3 in respective sub-pixel units. The capacitors C1, C2 and C3 are discharged to the extent that the potential of point a1 is V1+Vth1, the potential of point a2 is V1+Vth2, and the potential of point a3 is V1+Vth3, where Vth1, Vth2 and Vth3 are threshold voltages of driving units D16, D26 and D36 respectively During this discharge procedure, the currents would still not pass through the electroluminescent units O1, O2 and O3. The gate d1 of D16, the gate d2 of D26, and the gate d3 of D36 are input with the signal Vdata on the data line whose voltage is V1.

Figure 6:
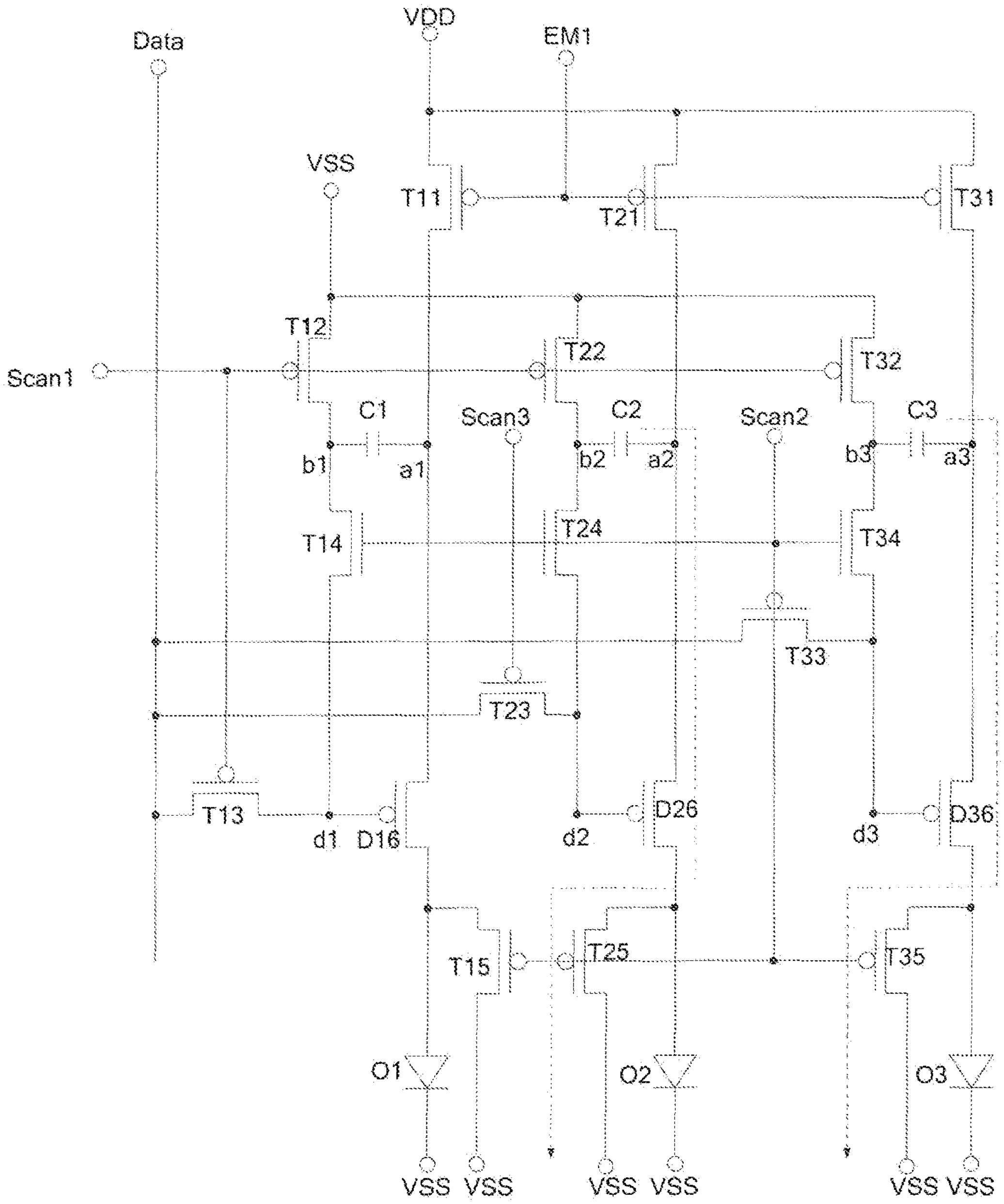
FIG. 6 is a schematic diagram of flow direction of current at phase w3 in the pixel circuit as provided in FIG. 2 of the present disclosure.

At the second discharge phase w3, Scan 1 is changed to the high voltage level, and the potential difference between the two electrodes of C1 is V1+Vth1; Scan2 and Scan3 continue to be at the low voltage level, and EM1 is at the high voltage level. The TFTs T23, T33, T15, T25 and T35 are turned on, and the other TFTs are turned off. Now, the voltage of the signal Vdata on the data line is V2. C2 and C3 in the second sub-pixel P2 and the third sub-pixel P3 continue to discharge (FIG. 6 shows the paths of the discharge current), the potential at electrode a2 of the capacitor C2 turns to V2+Vth2, and electrode a3 of the capacitor C3 turns to V2+Vth3, to prepare for the following phase.

Figure 7:
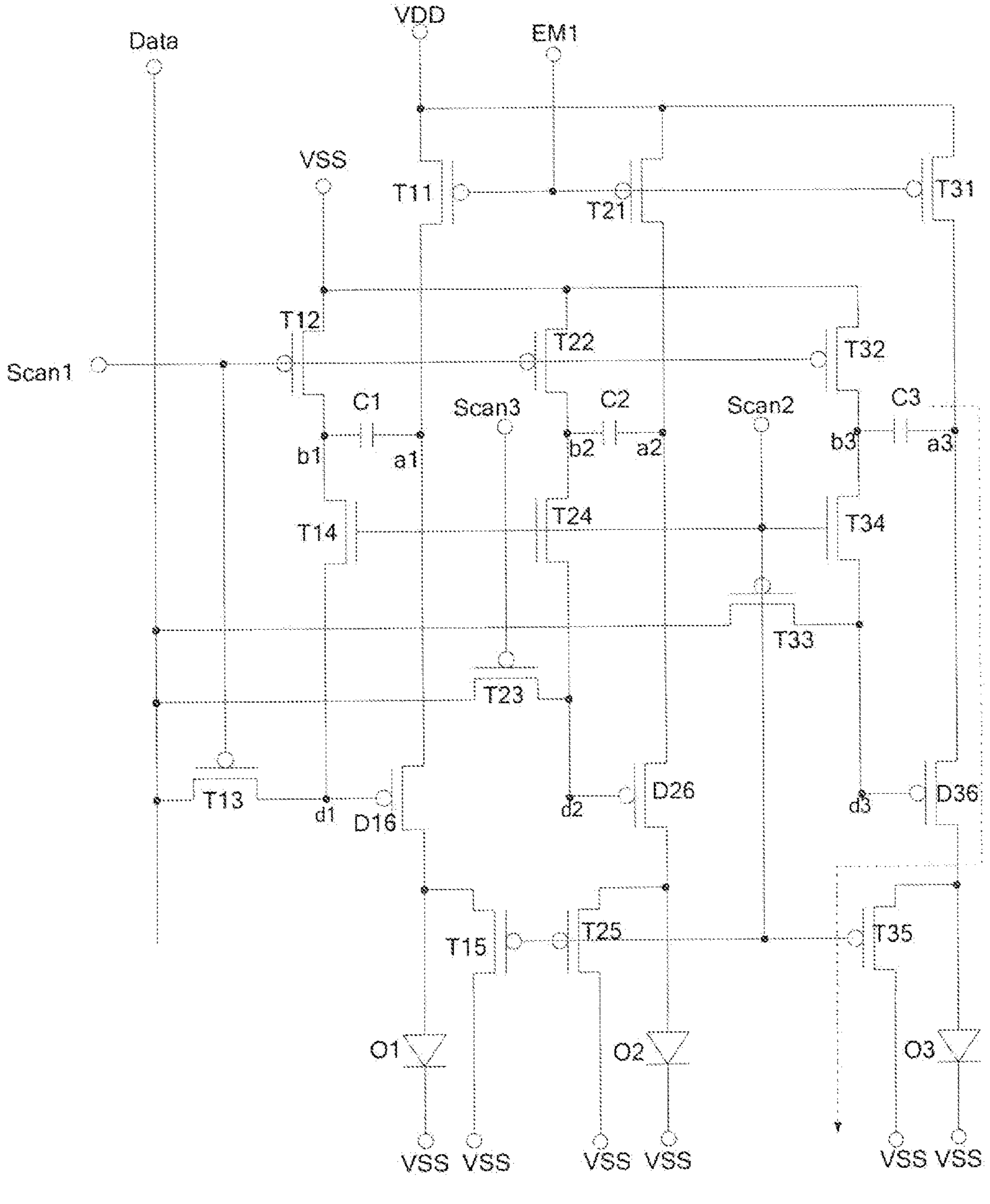
FIG. 7 is a schematic diagram of flow direction of current at phase w4 in the pixel circuit as provided in FIG. 2 of the present disclosure.

At the third discharge phase w4, EM1, Scan1 and Scan 3 are all at the high voltage level, and Scan2 is at the low voltage level. The TFTs T33, T15, T25 and T35 are turned on, and the other TFTs are turned off. C3 in the third sub-pixel circuit continues to discharge (FIG. 7 shows the path of discharge current), and now the signal Vdata of the data line has a voltage of V3. Therefore, the potential of electrode a3 of the capacitor C3 changes to V3+Vth3, to prepare for the following light emitting phase.

Figure 8:
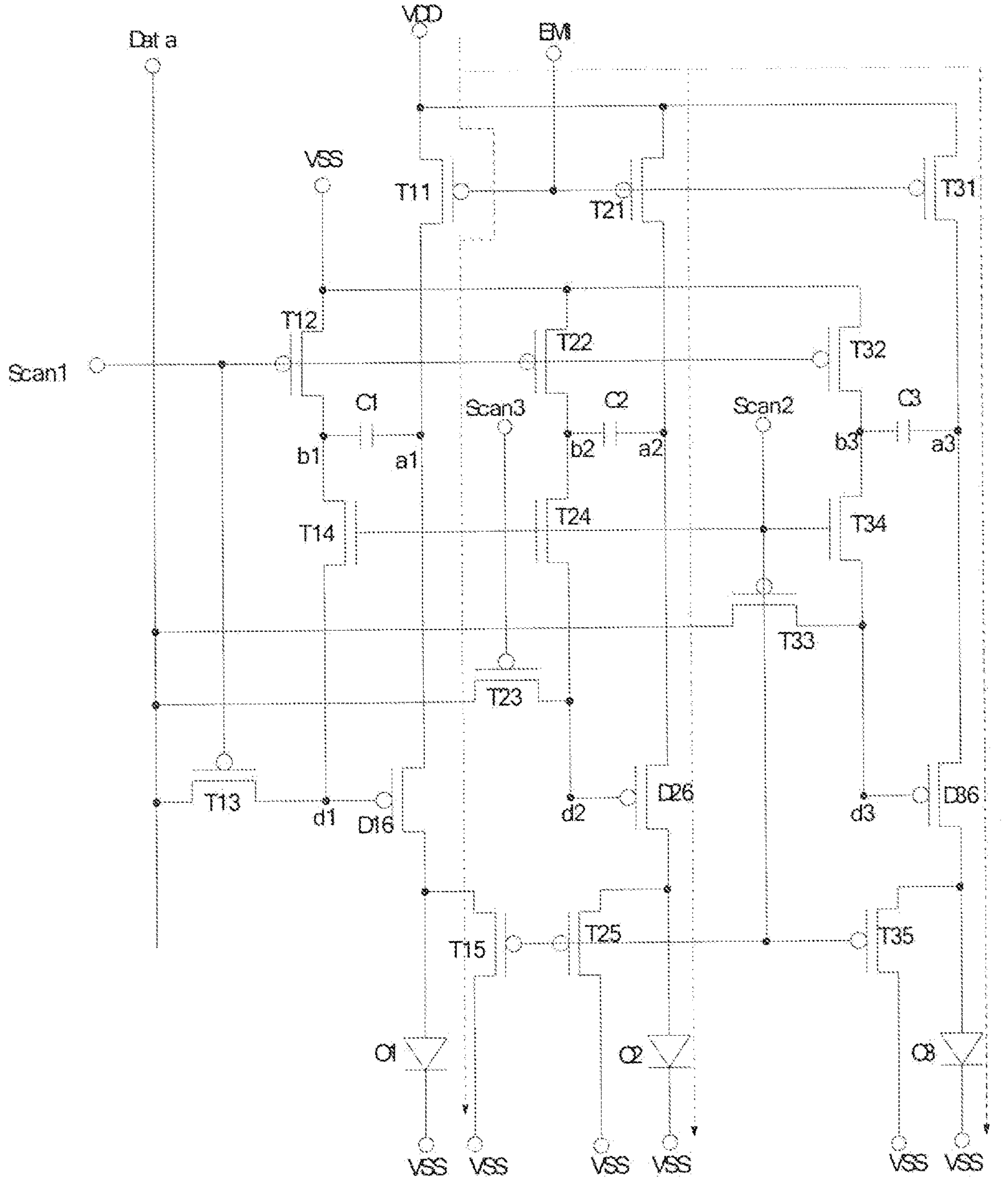
FIG. 8 is a schematic diagram of flow direction of current at phase w5 in the pixel circuit as provided in FIG. 2 of the present disclosure.

At the light emitting phase w5 which is the actual light emitting phase of the electroluminescent units O1, O2 and O3, EM1 is at the low voltage level, and Scan1, Scan2 and Scan3 are all at the high voltage level. The TFTs T11, T21, T31, T14, T24 and T34 are turned on, and the other TFTs are turned off. Electrode a1 of the capacitor C1, electrode a2 of C2, and electrode a3 of C3 are input with the high voltage level VDD of the first voltage terminal VA. Electrode b1 of the capacitor C1, electrode b2 of C2 and electrode b3 of C3 are floated, the original voltage differences are to be remained, and thus voltage jump with the same voltage differences will happen. Therefore, the potential at point d1 is VDD−V1−Vth1, the potential at point d2 is VDD−V2−Vth2, and the potential at point d3 is VDD−V3−Vth3. FIG. 8 shows the path of the current direction in the circuit at this phase.

According to the saturation current equation, the current $I_{OLED}$ flowing in O1 is calculated by the following equation:

$$\begin{aligned} I_{OLED} &= K(V_{GS} - Vth1)^2 \\ &= K[VDD - (VDD - V1 - Vth1) - Vth1]^2 \\ &= K \cdot V1^2 \end{aligned}$$

wherein Vth1 is the threshold voltage of the driving unit D16, Vth2 is the threshold voltage of the driving unit D26, and Vth3 is the threshold voltage of the driving unit D36.

Similarly, the current flowing in O2 is $I_{OLED}=K \cdot V2^2$, the current flowing in O3 is $I_{OLED}=K \cdot V3^2$; $V_{GS}$ is the voltage between the gate and the source of the driving transistor, $$K = \mu C_{ox}\frac{W}{L},$$

$\mu$ and $C_{ox}$ are process constants, W is the width of the TFT channel, L is the length of the TFT channel, W and L are both constants that can be designed selectively.

It can be seen from the above equation that the operating current $I_{OLED}$ now is not influenced by the threshold voltage of the driving transistor but only related to the voltage (V1, V2 and V3) on the data line Data, which completely solves the problem that the threshold voltage (Vth) drift of the driving transistors due to the process and low time operation influences the operating current $I_{OLED}$, eliminates the influence of the threshold voltage, and ensures the normal operation of the OLED.

Figure 9:
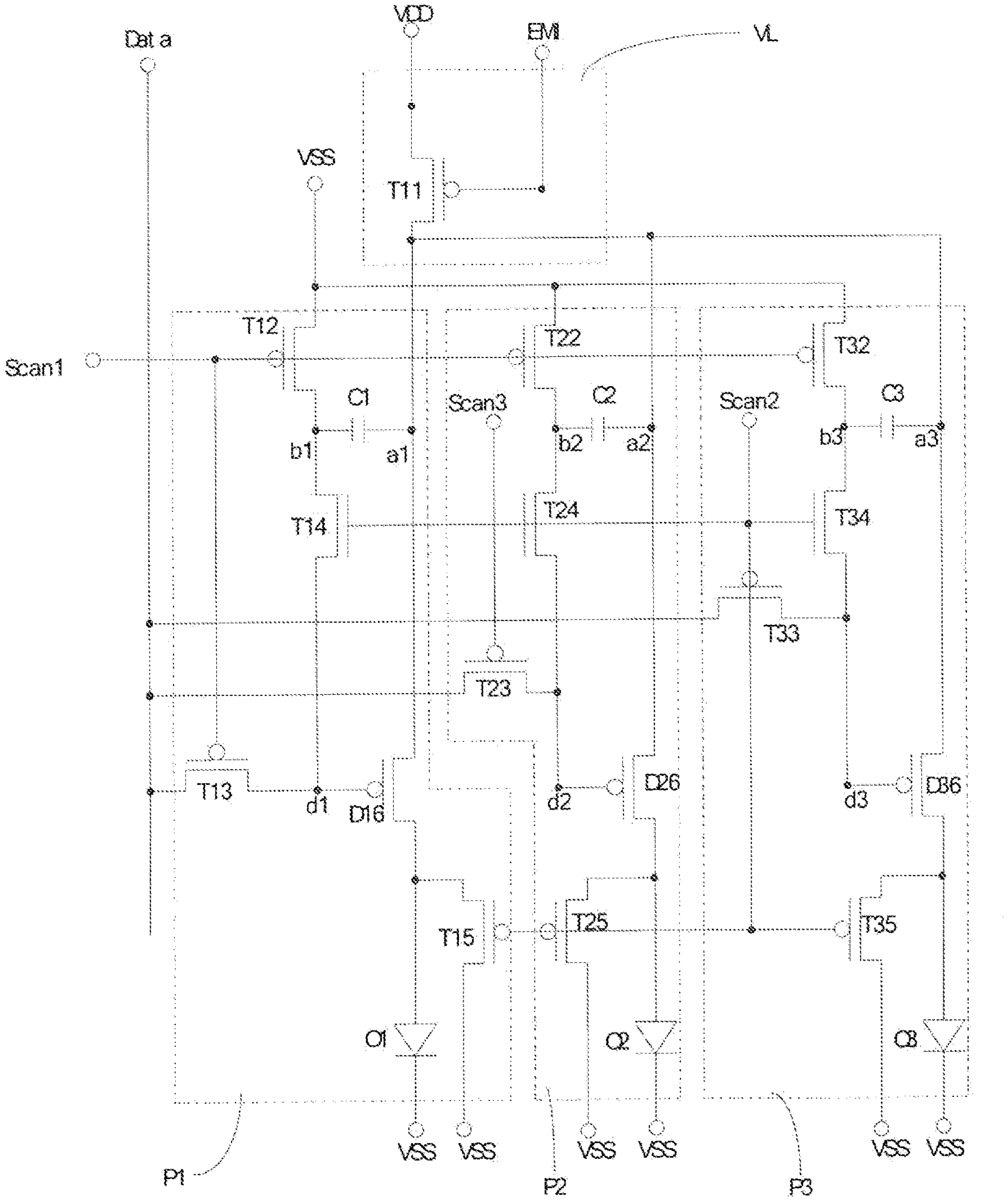
FIG. 9 is a schematic diagram of a structure of a pixel circuit provided by yet another embodiment of the present disclosure.

Further, the power supply circuit VL can only comprise one switch unit, i.e., the first switch unit T11. The control terminal of T11 is connected to the first signal control line EM1, the first terminal of T11 is connected to the first voltage level terminal VA, and the second terminal of T11 is connected to the three sub-pixel circuits, and the first switch unit T11 is configured to provide the first voltage level of the first voltage level terminal VA to the three sub-pixel circuits under the control of the signal of the first signal control line EM1. FIG. 9 is a schematic diagram of a structure of a pixel circuit provided by another embodiment of the present disclosure. As shown in FIG. 9, the power supply circuit VL now comprises only one TFT, which further reduces the wiring complexity of the circuit and reduces the cost of the integrated circuit. Reducing the number of the TFT devices in such a manner can dramatically reduce the sub-pixel size and decrease the IC cost, and thus obtain a higher picture quality.

In the pixel circuit provided by the embodiment of the present disclosure, three adjacent sub-pixel circuits share one data line, and one first voltage level terminal is configured to supply operating voltages to the three sub-pixel circuits. Therefore, it is possible to decrease the number of the signal lines used in the pixel circuit in the display apparatus, reduce the cost of the integrated circuit, and improve the pixel density of the display apparatus. At the same time, the operating current flowing through the electroluminescent unit is not influenced by the threshold voltage of the corresponding driving transistor, which completely solves the problem of nonuniformity of display brightness due to threshold voltage drift of the driving transistor.

Second Embodiment

Figure 10:
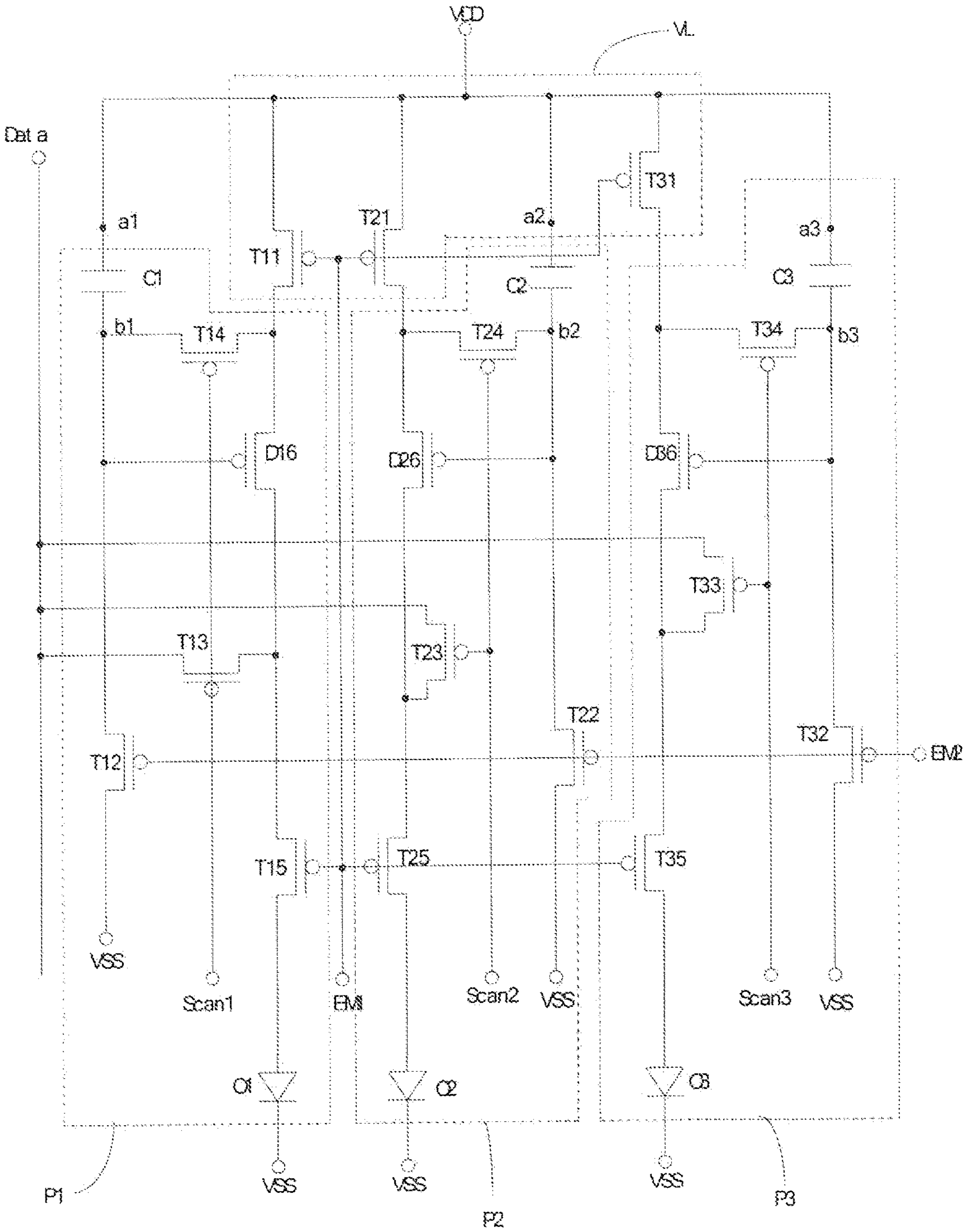
FIG. 10 is a schematic diagram of a structure of a pixel circuit provided by further another embodiment of the present disclosure.

FIG. 10 is a schematic diagram of a structure of a pixel circuit provided by further another embodiment of the present disclosure. Referring to FIG. 10, the pixel circuit comprises three sub-pixel circuits P1, P2 and P3, and one power supply circuit VL, wherein the three sub-pixel circuits share a data line Data.

The power supply circuit comprises a first switch unit T11, a second switch unit T21 and a third switch unit T31.

A control terminal of the first switch unit T1 is connected to the first signal control line EM1, a first terminal of the first switch unit T11 is connected to the first voltage level terminal VA, and a second terminal of the first switch unit T11 is connected to a first sub-pixel circuit P1 among the three sub-pixel circuits. T11 is configured to supply the first voltage level of the first voltage level terminal VA to the first sub-pixel circuit P1 under the control of a signal of the first signal control line EM1.

A control terminal of the second switch unit T21 is connected to the first signal control line EM1, a first terminal of the second switch unit T21 is connected to the first voltage level terminal VA, a second terminal of the second switch unit T21 is connected to a second sub-pixel circuit P2 among the three sub-pixel circuits. T21 is configured to supply the first voltage level of the first voltage level terminal VA to the second sub-pixel circuit P2 under the control of a signal of the first signal control line EM1.

A control terminal of the third switch unit T31 is connected to the first signal control line EM1, a first terminal of the third switch unit T3 is connected to the first voltage level terminal VA, a second terminal of the third switch unit T31 is connected to a third sub-pixel circuit P3 among the three sub-pixel circuits. T31 is configured to supply the first voltage level of the first voltage level terminal VA to the third sub-pixel circuit P3 under the control of a signal of the first signal control line EM1.

Further, the sub-pixel circuits P1, P2 and P3 are also connected to a second signal control line EM2 and the first voltage level terminal VA. Each of the sub-pixel circuits P1, P2 and P3 comprises four switch units, a driving unit, an energy storage unit and an electroluminescent unit. In order to distinguish those units, in P1, the four switch units comprised are a eighth switch unit T12, a ninth switch unit T13, a tenth switch unit T14, and an eleventh switch unit T15 in turn, the driving unit is D16, the energy storage unit is C1, the electroluminescent unit is O1; in P2, the four switch units comprised are an eighth switch unit T22, a ninth switch unit T23, a tenth switch unit T24, and an eleventh switch unit T25 in turn, the driving unit is D26, the energy storage unit is C2, the electroluminescent unit is O2; in P3, the four switch units comprised are an eighth switch unit T32, a ninth switch unit T33, a tenth switch unit T34, and an eleventh switch unit T35 in turn, the driving unit is D36, the energy storage unit is C3, the electroluminescent unit is O3.

In the following, description is made by taking the connection relationship of devices in P1 as an example only. The connection relationship of devices in P2 and P3 refers to P1, which will not be repeatedly herein.

A first electrode a1 of the energy storage unit C1 is connected to the first voltage level terminal VA to write the first voltage level of the first voltage level terminal VA into the first electrode a1 of the energy storage unit C1.

A control terminal of the eighth switch unit T12 is connected to the second signal control line EM2, a first terminal of the eighth switch unit 112 is connected to a second electrode b1 of the energy storage unit C1, a second terminal of the eighth switch unit T12 is connected to a second voltage level terminal VB, and the eighth switch unit T12 is configured to write a second voltage level of the second voltage level terminal VB into the second electrode b1 of the energy storage unit C1 under the control of a signal of the second signal control line EM2.

A control terminal of the ninth switch unit T13 is input with a second scan signal S2, a first terminal of the ninth switch unit T13 is connected to the data line Data, a second terminal of the ninth switch unit T13 is connected to an output terminal of the driving unit D16, and the ninth switch unit T13 is configured to write a signal of the data line Data into the output terminal of the driving unit D16 under the control of the second scan signal S2.

A control terminal of the tenth switch unit T14 is input with a first scan signal S1, a first terminal of the tenth switch unit T14 is connected to the second electrode b1 of the energy storage unit C1, a second terminal of the tenth switch unit T14 is connected to an input terminal of the driving unit D16 and the power supply circuit VL, and the tenth switch unit T14 is configured to write the signal of the data line Data and a threshold voltage of the driving unit D16 into the second electrode b1 of the energy storage unit C1.

A control terminal of the driving unit D16 is connected to the first terminal of the tenth switch unit T14, and the driving unit D16 is configured to output a driving current at the output terminal.

A control terminal of the eleventh switch unit T15 is connected to the first signal control line EM1, a first terminal of the eleventh switch unit T15 is connected to the output terminal of the driving unit D16, and the eleventh switch unit T15 is configured to control the driving current to be input into a first electrode of the electroluminescent unit O1 under the control of the signal of the first signal control line EM1.

The first electrode of the electroluminescent unit O1 is connected to the second terminal of the eleventh switch unit T15, a second electrode of the electroluminescent unit O1 is connected to the second voltage level terminal VB, and the electroluminescent unit is configured to display the gray scale under the control of the driving current.

Optionally, in the same one of the sub-pixel circuits, the control terminal of the ninth switch unit (T13, T23 or T23) and the control terminal of the tenth switch unit (T14, T24 or T34) share one scan line to make the first scan signal S1 and the second scan signal S2 have the same time sequence. As shown in FIG. 10, the control terminal of T13 and the control terminal of T14 in P1 are connected to the first scan line Scan1, the control terminal of T23 and the control terminal of T24 in P2 are connected to the second scan line Scan2, and the control terminal of T33 and the control terminal of T34 in P3 are connected to the third scan lien Scan3. Sharing scan lines can reduce the number of signal lines of the pixel circuit, and reduce the cost of the integrated circuit.

For example, the first voltage level is a high voltage level VDD, and the second voltage level is a low voltage level VSS provided by being grounded.

Figure 11:
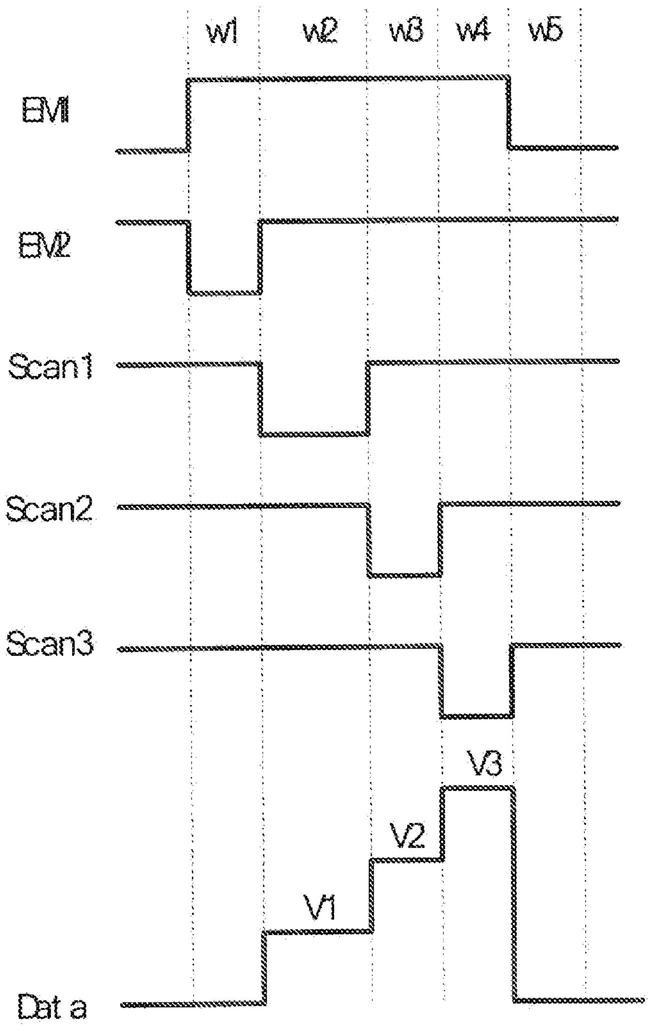
FIG. 11 is a diagram of a time sequence of key signals in the pixel circuit as provided in FIG. 10 of the present disclosure.

FIG. 11 is a diagram of a time sequence of key signals in the pixel circuit as provided in FIG. 10 of the present disclosure. FIGS. 12-16 are schematic diagrams of flow direction of current at phases w1, w2, w3, w4, w5 in the pixel circuit as provided in FIG. 10 of the present disclosure. In the following, description is made on the operating principle of the pixel circuit provided by FIG. 10 with an example that the first voltage level is the high voltage level VDD and the second voltage level is the low voltage level VSS being grounded, in connection with the signal time sequence diagram shown in FIG. 11 and the schematic diagrams of flow direction in FIGS. 12-16. Description is made with an example that the switch units are thin film transistors (simply referred to as switch transistors or TFTs), the driving units are driving-type thin film transistors (simply referred to as driving transistors or DTFTs), the energy storage unit are capacitors, and the electroluminescent units are organic light emitting diodes (OLEDs). FIG. 11 also shows the time sequence signals of the first scan line Scan1, the second scan line Scan2 and the third scan line Scan3. Description is made by an example that all the switch units are P type switch transistors. The signal time sequence diagram shown in FIG. 11 can be divided into five phases, which are represented as a reset phase w1, a first discharge phase w2, a second discharge phase w3, a third discharge phase w4, and a light emitting phase w5, respectively.

Figure 12:
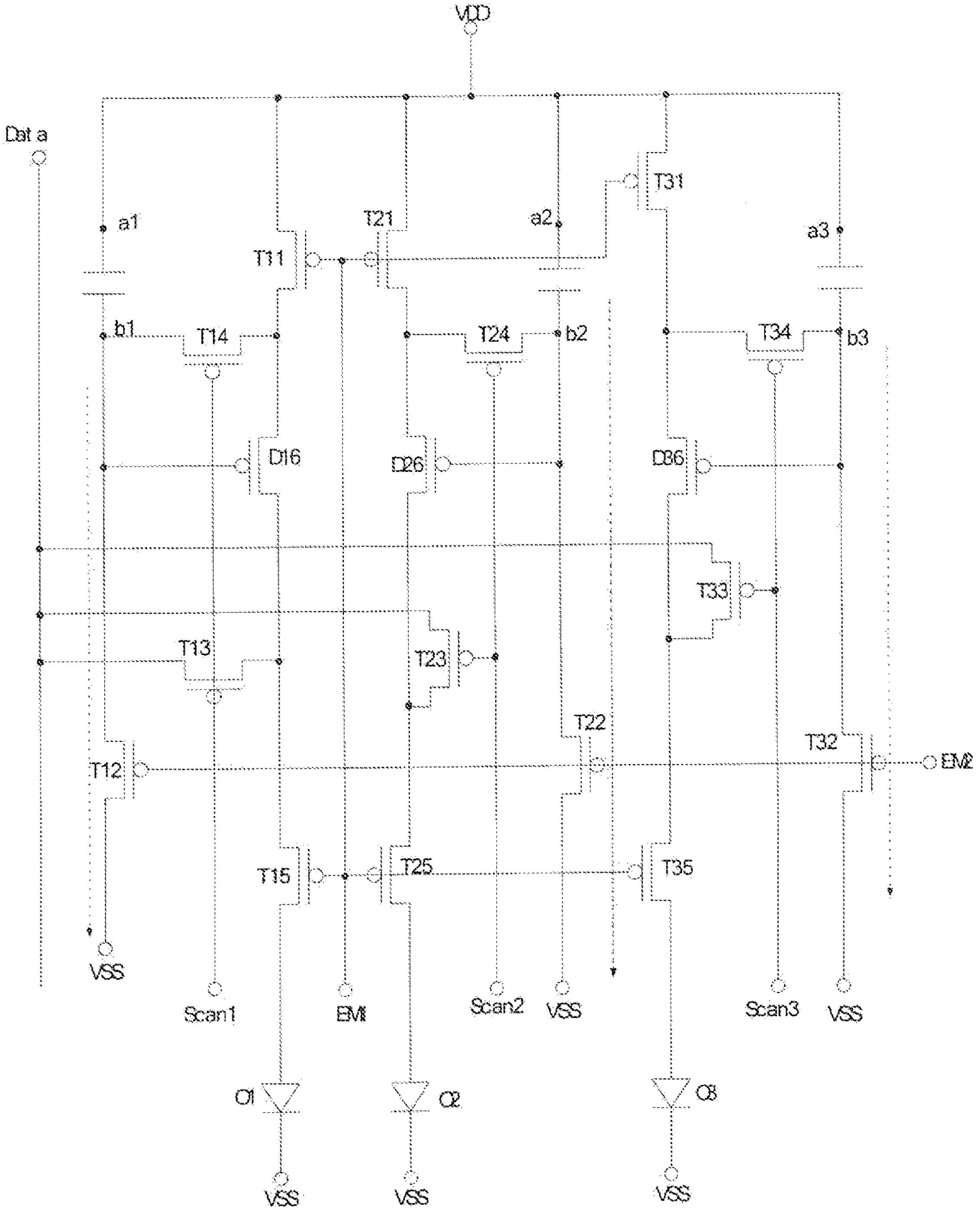
FIG. 12 is a schematic diagram of flow direction of current at phase w1 in the pixel circuit as provided in FIG. 10 of the present disclosure.

At the reset phase w1, EM1, Scan1, Scan2 and Scan3 are at high voltage levels, EM2 is at a low voltage level. The TFTs T12, T22 and T32 are turned on, and the other TFTs are all turned off. The second electrode b1 of the capacitor C1, the second electrode b2 of the capacitor C2, and the second electrode b3 of C3 are grounded simultaneously, and the three have a potential of 0V, the first electrodes a1, a2 and a3 are input with a high voltage VDD. Referring to FIG. 12, it is shown the schematic diagram of current direction at phase w1.

Figure 13:
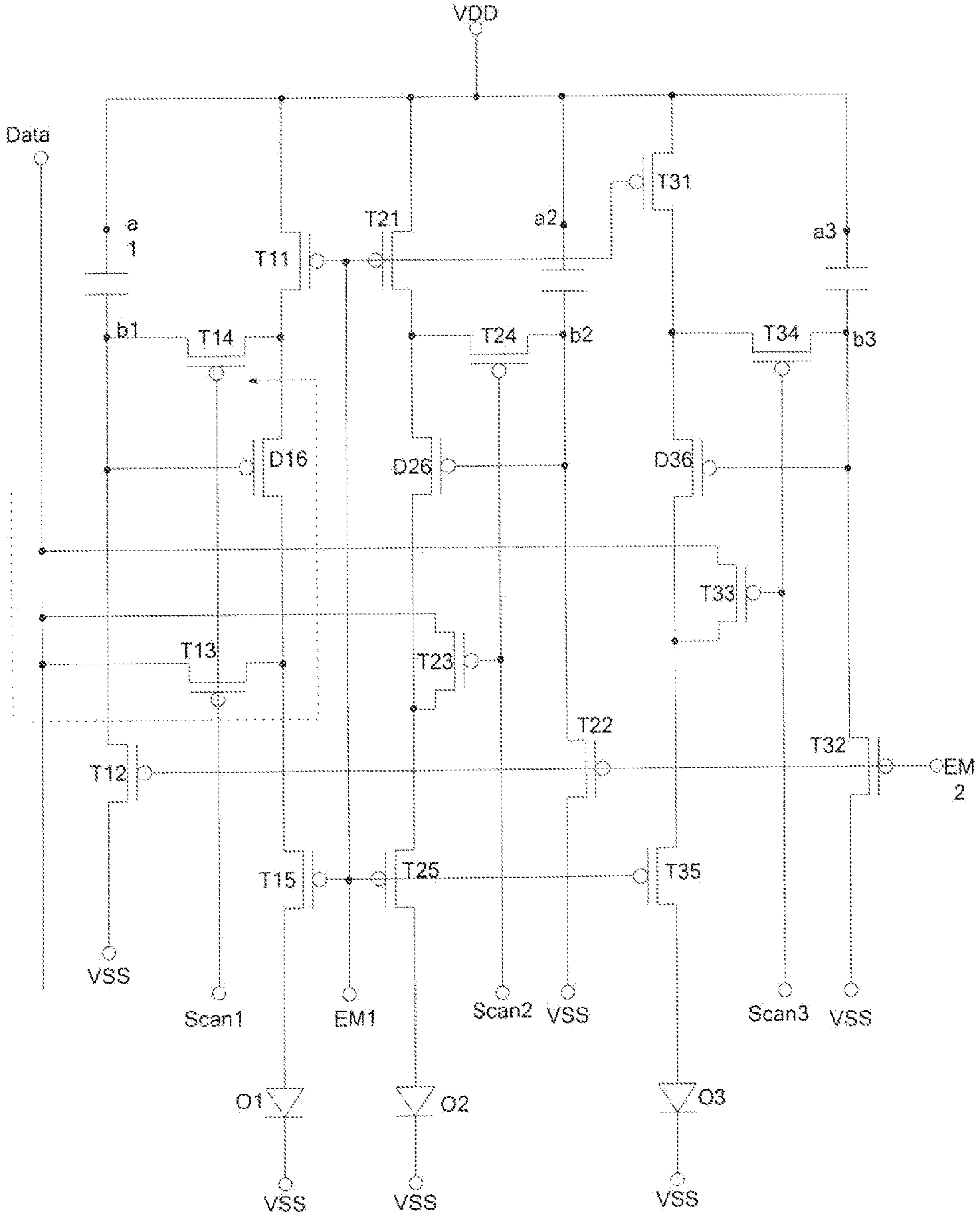
FIG. 13 is a schematic diagram of flow direction of current at phase w2 in the pixel circuit as provided in FIG. 10 of the present disclosure.

At the first discharge phase w2, Scan1 is at the low voltage level, and Scan2, Scan3, EM1 and EM2 are all at the high voltage level, and the voltage level of the data line is V1. The TFTs T13 and T14 are turned on, and the other TFTs are all turned off. The capacitor C1 is discharged (FIG. 13 shows the discharge path of C1 in the sub-pixel unit P1) to the extent that the potential of point b1 is V1−Vth1, and the potential of point a1 is VDD, where Vth1 is the threshold voltage of the driving unit DI 6.

Figure 14:
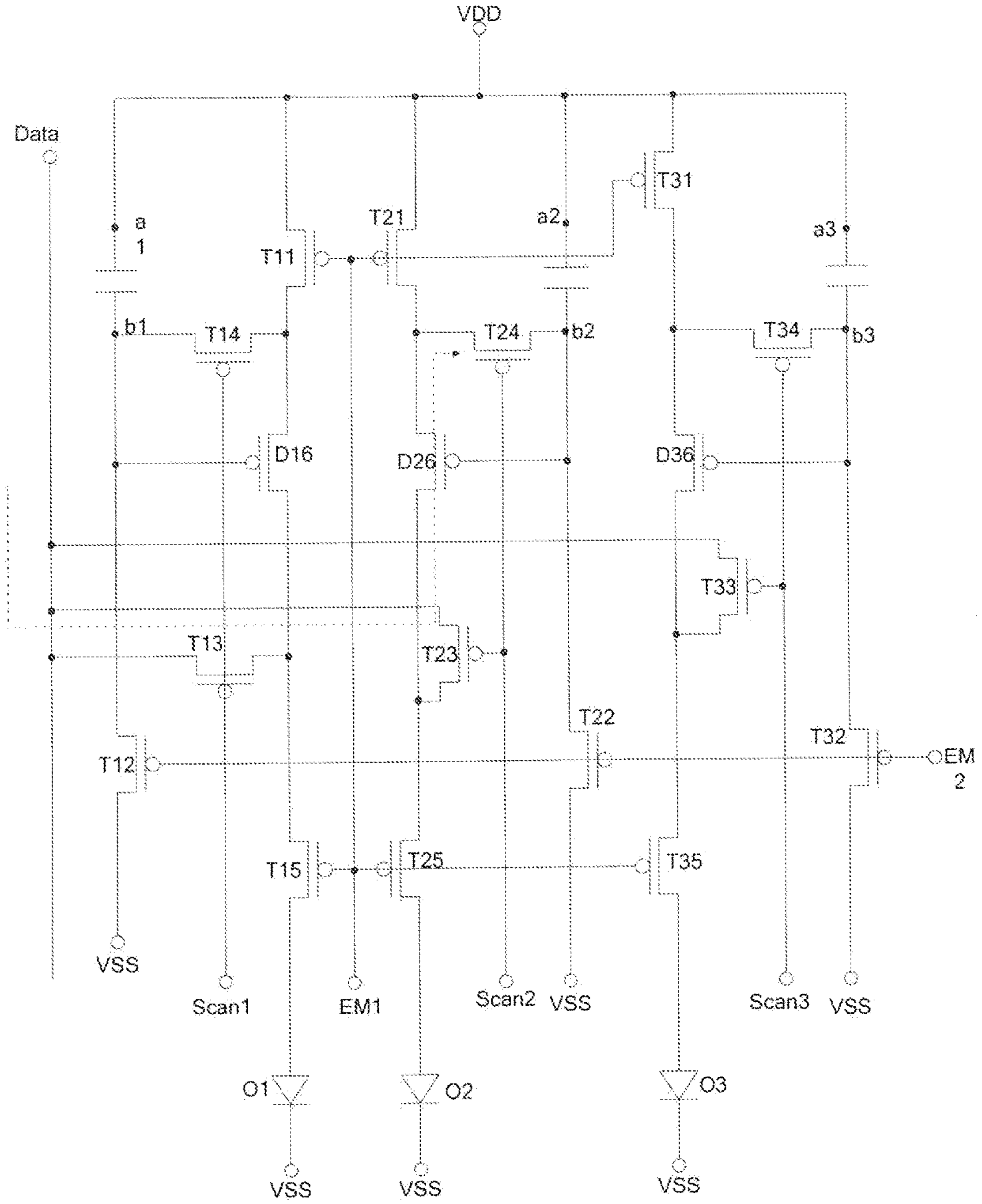
FIG. 14 is a schematic diagram of flow direction of current at phase w3 in the pixel circuit as provided in FIG. 10 of the present disclosure.

At the second discharge phase w3, Scan2 is at the low voltage level, Scan1, Scan3, EM1 and EM2 are all at the high voltage level, and the voltage level of the data line is V2. The TFTs T23 and T24 are turned on, and the other TFTs are turned off. The capacitor C2 is discharged (FIG. 14 shows the discharge path of C2 in the sub-pixel unit P2) to the extent that the potential of point b2 is V2−Vth2, and the potential of point a2 is VDD, where Vth2 is the threshold voltage of the driving unit D26.

Figure 15:
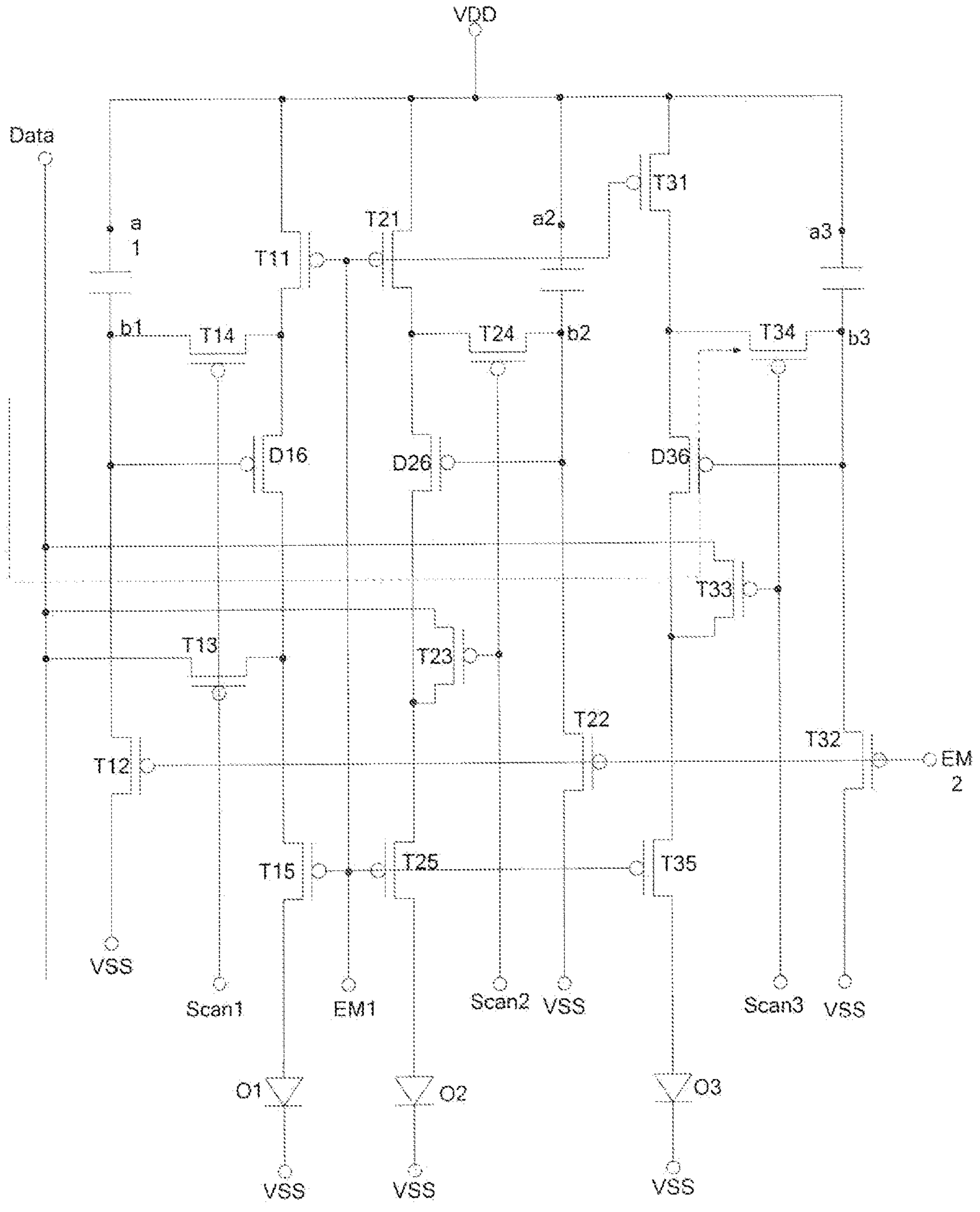
FIG. 15 is a schematic diagram of flow direction of current at phase w4 in the pixel circuit as provided in FIG. 10 of the present disclosure.

At the third discharge phase w4, Scan3 is at the low voltage level, Scan1, Scan2, EM1 and EM2 are all at the high voltage level, and the voltage level of the data line is V3. The TFTs T33 and T34 are turned on, and the other TFTs are turned off. The capacitor C3 is discharged (FIG. 15 shows the discharge path of C3 in the sub-pixel unit P3) to the extent that the potential of point b3 is V3−Vth3, and the potential of point a3 is VDD, where Vth3 is the threshold voltage of the driving unit D36.

Figure 16:
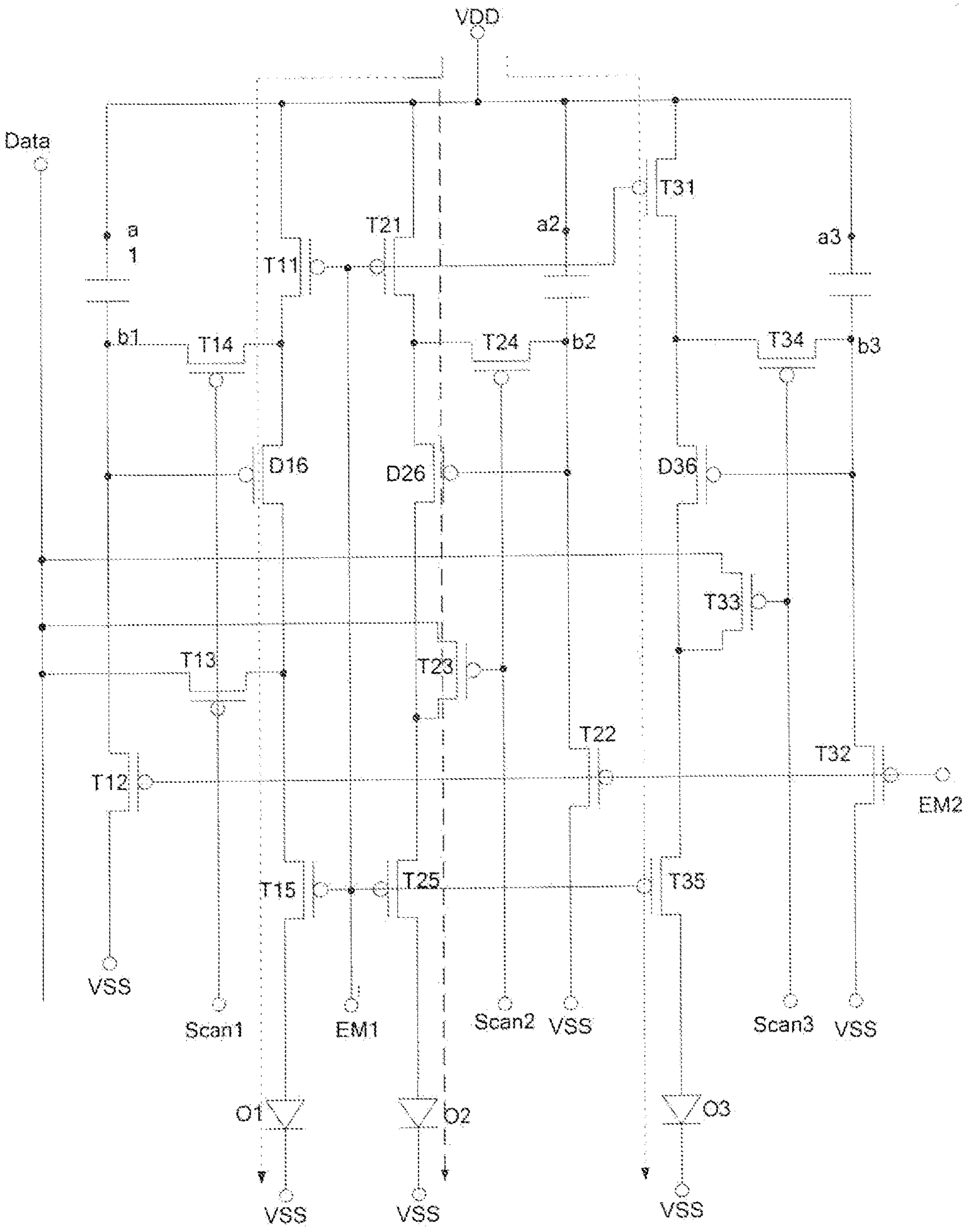
FIG. 16 is a schematic diagram of flow direction of current at phase w5 in the pixel circuit as provided in FIG. 10 of the present disclosure.

At the light emitting phase w5 which is the actual light emitting phase of the electroluminescent units O1, O2 and O3, EM1 is at the low voltage level, and Scan1. Scan2, Scan3 and EM2 are all at the high voltage level. The TFTs T11, T21, T31, T15, T25 and T35 are turned on, and the other TFTs are turned off. Electrode a1 of the capacitor C1, electrode a2 of C2, and electrode a3 of C3 are input with the high voltage level VDD of the first voltage terminal VA. The capacitors C1, C2 and C3 remain the original voltage differences. The potential at the gate b1 of D16 is V1−Vth1, the potential at the gate b2 of D26 is V2−Vth2, and the potential at the gate b3 of D36 is V3−Vth3. FIG. 16 shows the current direction in the circuit at this phase.

According to the saturation current equation, the current $I_{OLED}$ flowing in O1 is calculated by the following equation:

$$\begin{aligned} I_{OLED} &= K(V_{GS} - Vth1)^2 \\ &= K[VDD - (V1 - Vth1) - Vth1]^2 \\ &= K \cdot (VDD - V1)^2 \end{aligned}$$

wherein Vth1 is the threshold voltage of the driving unit D16, Vth2 is the threshold voltage of the driving unit D26, and Vth3 is the threshold voltage of the driving unit D36.

Similarly, the current flowing in O2 is $I_{OLED}$=K·(VDD−V2)$^2$, the current flowing in O3 is $I_{OLED}$=K·(VDD−V3)$^2$; $V_{GS}$ is the voltage between the gate and the source of the driving transistor, $$K = \mu C_{ox}\frac{W}{L},$$

μ and $C_{ox}$ are process constants, W is the width of the TFT channel, L is the length of the TFT channel. W and L are both constants that can be designed selectively.

It can be seen from the above equation that the operating current $I_{OLED}$ now is not influenced by the threshold voltage of the driving transistor but only related to the voltage (V1, V2 and V3) on the data line Data, which completely solves the problem that the threshold voltage (Vth) drift of the driving transistors due to the process and low time operation influences the operating current $I_{OLED}$, eliminates the influence of the threshold voltage to $I_{OLED}$, and ensures the normal operation of the OLED.

Figure 17:
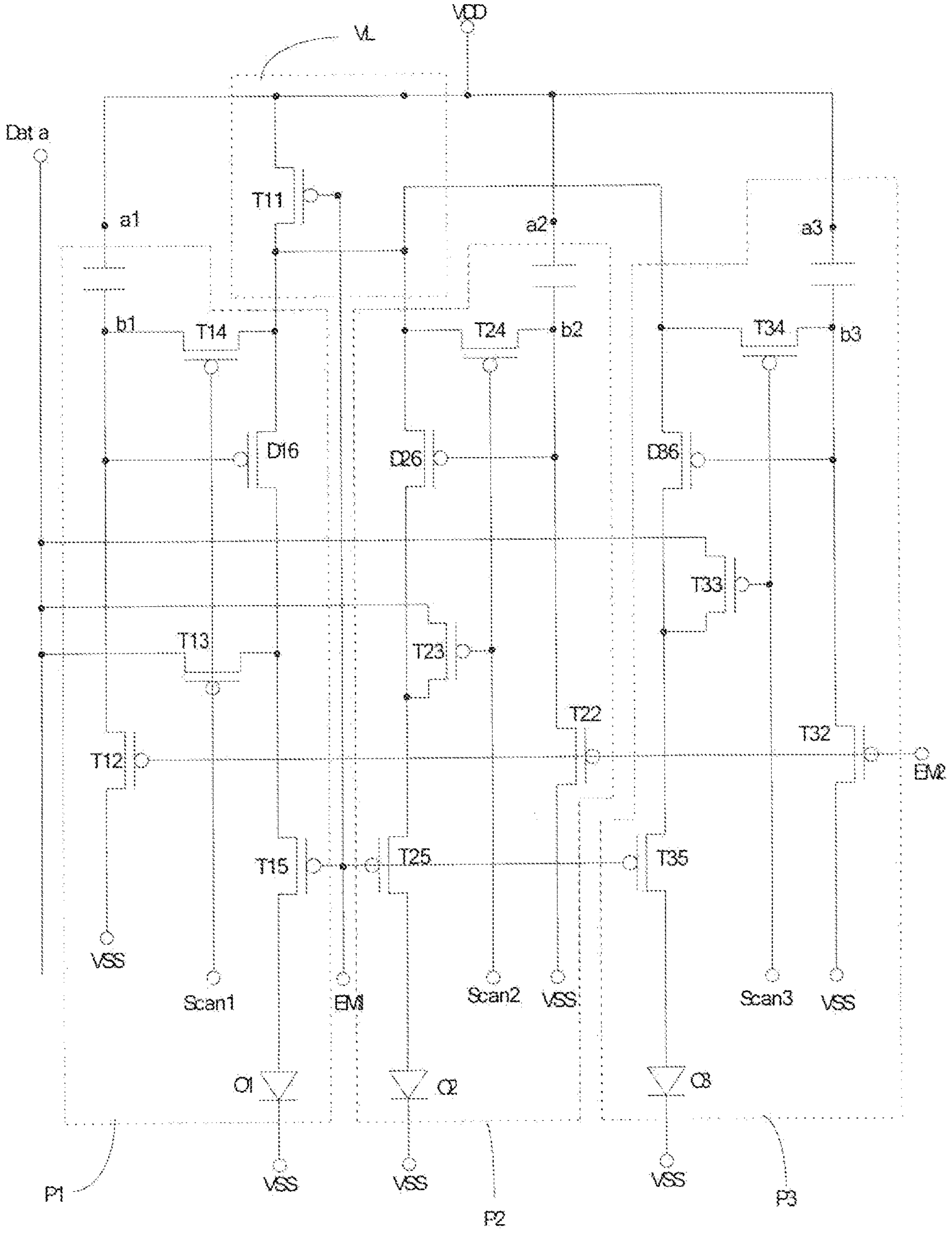
FIG. 17 is a schematic diagram of a structure of a pixel circuit provided by yet another embodiment of the present disclosure.

Further, the power supply circuit VL can only comprise one switch unit, i.e., the first switch unit T11. The control terminal of T11 is connected to the first signal control line EM1, the first terminal of T11 is connected to the first voltage level terminal VA, and the second terminal of T11 is connected to the three sub-pixel circuits, and the first switch unit T11 is configured to provide the first voltage level of the first voltage level terminal VA to the three sub-pixel circuits under the control of the signal of the first signal control line EM1. FIG. 17 is a schematic diagram of a structure of a pixel circuit provided by another embodiment of the present disclosure. As shown in FIG. 17, the power supply circuit VL now comprises only one TFT, which further reduces the wiring complexity of the circuit and reduces the cost of the integrated circuit. Reducing the number of the TFT devices in such a manner can dramatically reduce the sub-pixel size and decrease the IC cost, and thus obtain a higher picture quality.

In the pixel circuit provided by the embodiment of the present disclosure, three adjacent sub-pixel circuits share one data line, and one first voltage level terminal is configured to supply operating voltages to the three sub-pixel circuits. Therefore, it is possible to decrease the number of the signal lines used in the pixel circuit in the display apparatus, reduce the cost of the integrated circuit, and improve the pixel density of the display apparatus. At the same time, the operating current flowing through the electroluminescent unit is not influenced by the threshold voltage of the corresponding driving transistor, which completely solves the problem of nonuniformity of display brightness due to threshold voltage drift of the driving transistor.

Third Embodiment

Figure 18:
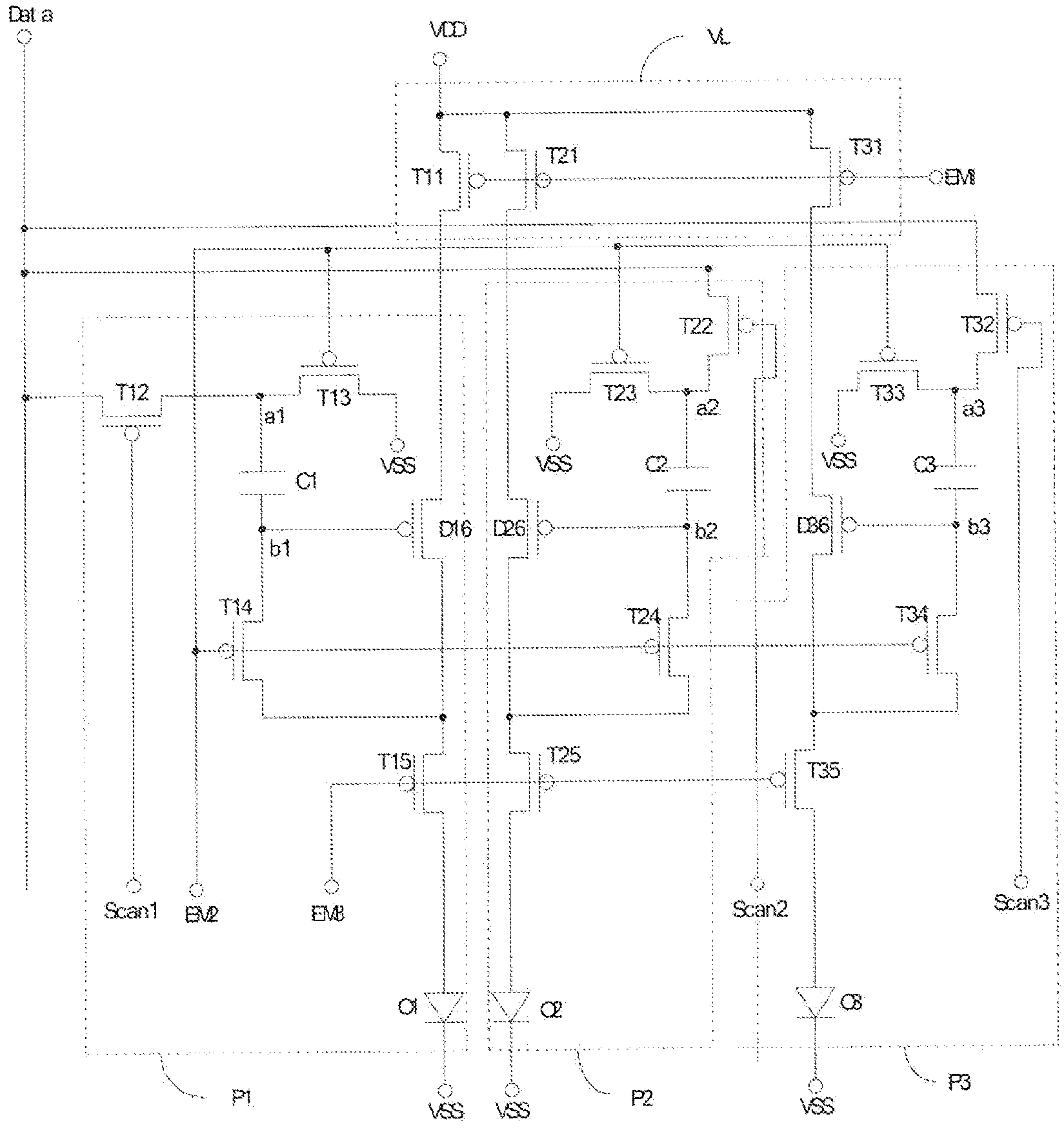
FIG. 18 is a schematic diagram of a structure of a pixel circuit provided by further another embodiment of the present disclosure.

FIG. 18 is a schematic diagram of a structure of a pixel circuit provided by further another embodiment of the present disclosure. Referring to FIG. 18, the pixel circuit comprises three sub-pixel circuits P1, P2 and P3, and one power supply circuit VL, wherein the three sub-pixel circuits share a data line Data.

The power supply circuit VL comprises a first switch unit T11, a second switch unit T21 and a third switch unit T31.

A control terminal of the first switch unit 11 is connected to a first signal control line EM1, a first terminal of the first switch unit T11 is connected to the first voltage level terminal VA, and a second terminal of the first switch unit T11 is connected to a first sub-pixel circuit P1 among the three sub-pixel circuits. The power supply circuit VL is configured to supply a first voltage level of the first voltage level terminal VA to the first sub-pixel circuit P1 under the control of a signal of the first signal control line EM1.

A control terminal of the second switch unit T21 is connected to the first signal control line EM1, a first terminal of the second switch unit T21 is connected to the first voltage level terminal VA, a second terminal of the second switch unit T21 is connected to a second sub-pixel circuit P2 among the three sub-pixel circuits. The power supply circuit VL is configured to supply the first voltage level of the first voltage level terminal VA to the second sub-pixel circuit P2 under the control of a signal of the first signal control line EM1.

A control terminal of the third switch unit T31 is connected to the first signal control line EM1, a first terminal of the third switch unit T31 is connected to the first voltage level terminal VA, a second terminal of the third switch unit T31 is connected to a third sub-pixel circuit P3 among the three sub-pixel circuits. The power supply circuit VL is configured to supply the first voltage level of the first voltage level terminal VA to the third sub-pixel circuit P3 under the control of a signal of the first signal control line EM1.

Further, the sub-pixel circuits P1, P2 and P3 are also connected to a second signal control line EM2 and a third signal control line EM3. Each of the sub-pixel circuits P1, P2 and P3 comprises four switch units, a driving unit, an energy storage unit and an electroluminescent unit. In order to distinguish those units, in P1, the four switch units comprised are a twelfth switch unit T12, a thirteenth switch unit T13, a fourteenth switch unit T14, and a fifteenth switch unit T15 in turn, the driving unit is D16, the energy storage unit is C1, the electroluminescent unit is O1; in P2, the four switch units comprised are a twelfth switch unit T22, a thirteenth switch unit T23, a fourteenth switch unit T24, and a fifteenth switch unit T25 in turn, the driving unit is D26, the energy storage unit is C2, the electroluminescent unit is O2; in P3, the four switch units comprised are a twelfth switch unit T32, a thirteenth switch unit T33, a fourteenth switch unit T34, and a fifteenth switch unit T35 in turn, the driving unit is D36, the energy storage unit is C3, the electroluminescent unit is O3.

In the following, description is made by taking the connection relationship of devices in P1 as an example only. The connection relationship of devices in P2 and P3 refers to P1, which will not be repeatedly herein.

A control terminal of the twelfth switch unit T12 is input with a first scan signal S1, a first terminal of the twelfth switch unit T12 is connected to the data line Data, a second terminal of the twelfth switch unit T12 is connected to a first electrode a1 of the energy storage unit C1, and the twelfth switch unit T12 is configured to write a signal of the data line into the first electrode a1 of the energy storage unit C1 under the control of the first scan signal.

A control terminal of the thirteenth switch unit T13 is connected to the second signal control line EM2, a first terminal of the thirteenth switch unit T13 is connected to the second terminal of the twelfth switch unit T12, a second terminal of the thirteenth switch unit T13 is connected to a second voltage level terminal VB, and the thirteenth switch unit T13 is configured to write a second voltage level of the second voltage level terminal VB into the first electrode a1 of the energy storage unit C1 under the control of a signal of the second signal control line EM2.

A control terminal of the fourteenth switch unit T14 is connected to the second signal control line EM2, a first terminal of the fourteenth switch unit T14 is connected to a second electrode b1 of the energy storage unit C1, a second terminal of the fourteenth switch unit T14 is connected to an output terminal of the driving unit D16, and the fourteenth switch unit T14 is configured to write the first voltage level and a threshold voltage of D16 into the second electrode b1 of the energy storage unit C1 under the control of the signal of the second signal control line EM2.

An input terminal of the driving unit D16 is connected to the power supply circuit VL, a control terminal of the driving unit D16 is connected to the second electrode b1 of the energy storage unit C1, the output terminal of the driving unit D16 is connected to the second terminal of the fourteenth switch unit T14, and the driving unit D16 is configured to output a driving current at the output terminal.

A control terminal of the fifteenth switch unit T15 is connected to the third signal control line EM3, a first terminal of the fifteenth switch unit T15 is connected to the output terminal of the driving unit D16, and the fifteenth switch unit T15 is configured to control the driving current to be input into a first electrode of the electroluminescent unit O1 under the control of a signal of the third signal control line EM3.

The first electrode of the electroluminescent unit O1 is connected to the second terminal of the fifteenth switch unit T15, a second electrode of the electroluminescent unit O1 is connected to the second voltage level terminal VB, and the electroluminescent unit O1 is configured to display the gray scale under the control of the driving current.

For example, the first voltage level is a high voltage level VDD, and the second voltage level is a low voltage level VSS provided by being grounded.

Figure 19:
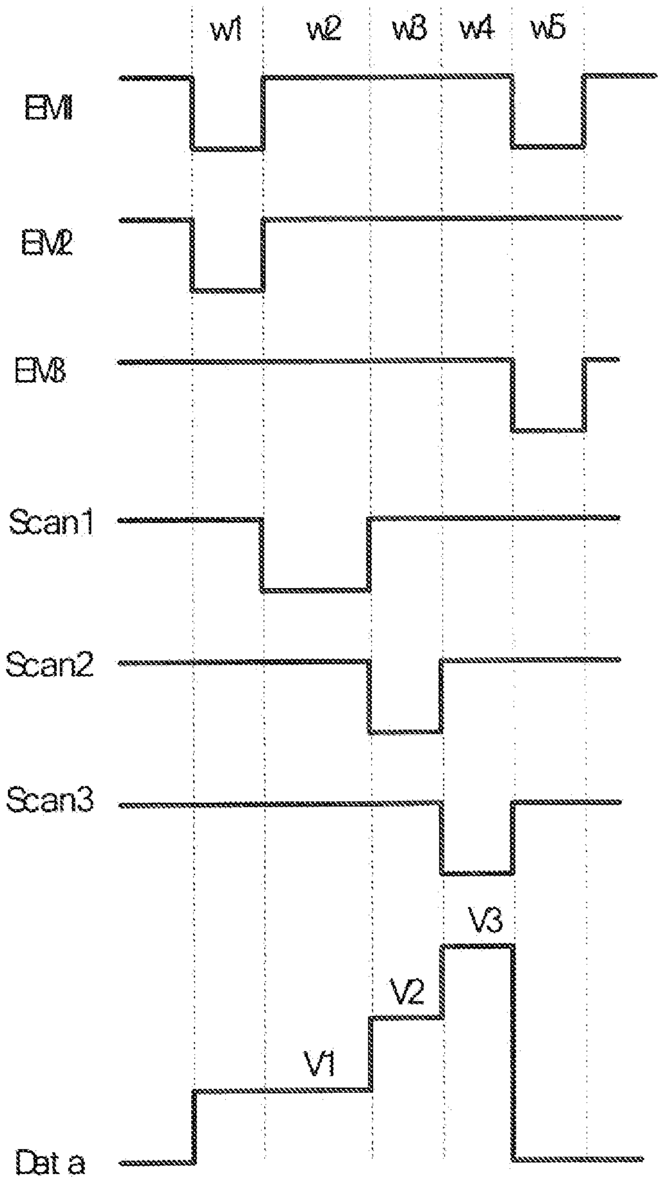
FIG. 19 is a diagram of a time sequence of key signals in the pixel circuit as provided in FIG. 18 of the present disclosure.

FIG. 19 is a diagram of a time sequence of key signals in the pixel circuit as provided in FIG. 18 of the present disclosure. FIGS. 20-24 are schematic diagrams of flow direction of current at phases w1, w2, w3, w4, w5 in the pixel circuit as provided in FIG. 18 of the present disclosure. In the following, description is made on the operating principle of the pixel circuit provided by FIG. 8 with an example that the first voltage level is the high voltage level VDD and the second voltage level is the low voltage level VSS being grounded, in connection with the signal time sequence diagram shown in FIG. 19 and the schematic diagrams of flow direction of current in FIGS. 20-24. Description is made with an example that the switch units are thin film transistors (simply referred to as switch transistors or TFTs), the driving units are driving-type thin film transistors (simply referred to as driving transistors or DTFTs), the energy storage units are capacitors, and the electroluminescent units are organic light emitting diodes (OLEDs). FIG. 19 also shows the time sequence signals of EM1, EM2, EM3, the first scan line Scan1, the second scan line Scan2 and the third scan line Scan3, wherein the first scan line Scan1 supplies the first scan signal to T12 of P, the second scan line Scan2 supplies the first scan signal to T22 of P2, and the third scan line Scan3 supplies the first scan signal to T32 of P3. Description is made by an example that all the switch units are P type switch transistors. The signal time sequence diagram shown in FIG. 18 can be divided into five phases, which are represented as a charge phase w1, a first pixel compensation phase w2, a second pixel compensation phase w3, a third pixel compensation phase w4, and a light emitting phase w5, respectively.

Figure 20:
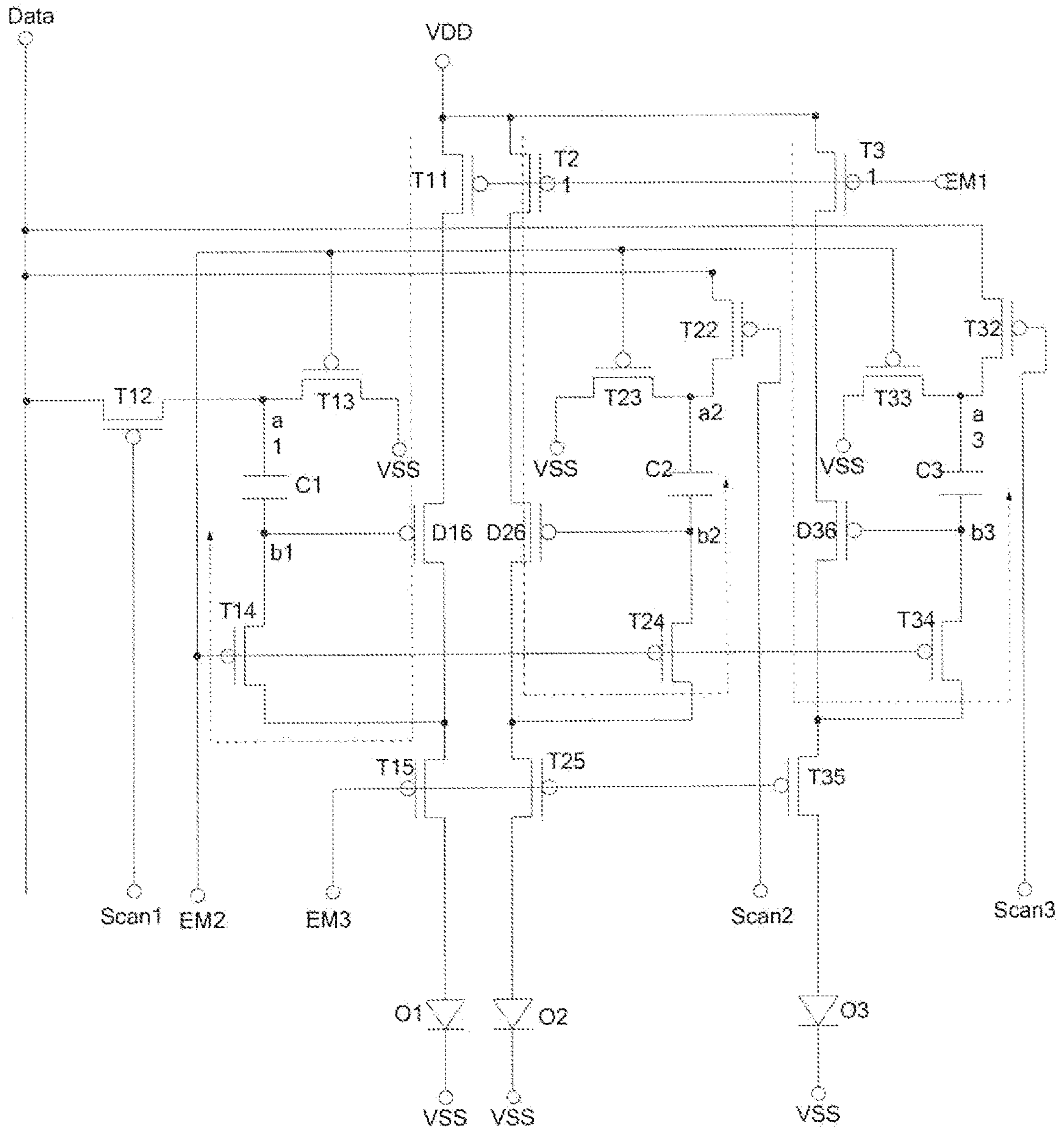
FIG. 20 is a schematic diagram of flow direction of current at phase w1 in the pixel circuit as provided in FIG. 18 of the present disclosure.

At the charge phase w1, Scan1, Scan2, Scan3 and EM3 are at a high voltage level, and EM1 and EM2 are at a low voltage level. The TFTs T12, 122, T32, T15, T25 and T35 are turned off, and the other TFTs are turned on. The capacitors C1, C2 and C3 are discharged along the flow directions of current as shown in FIG. 20 to the extent that the potential at point b1 is VDD−Vth1, the potential at point b2 is VDD−Vth2, and the potential at point b3 is VDD−Vth3, where Vth1, Vth2 and Vth3 are threshold voltages of D16, D26 and 36, respectively. During this discharge process, the current would not pass through O1, O2 and O3. Points a1, a2 and a3 are grounded, whose voltages are all 0V.

Figure 21:
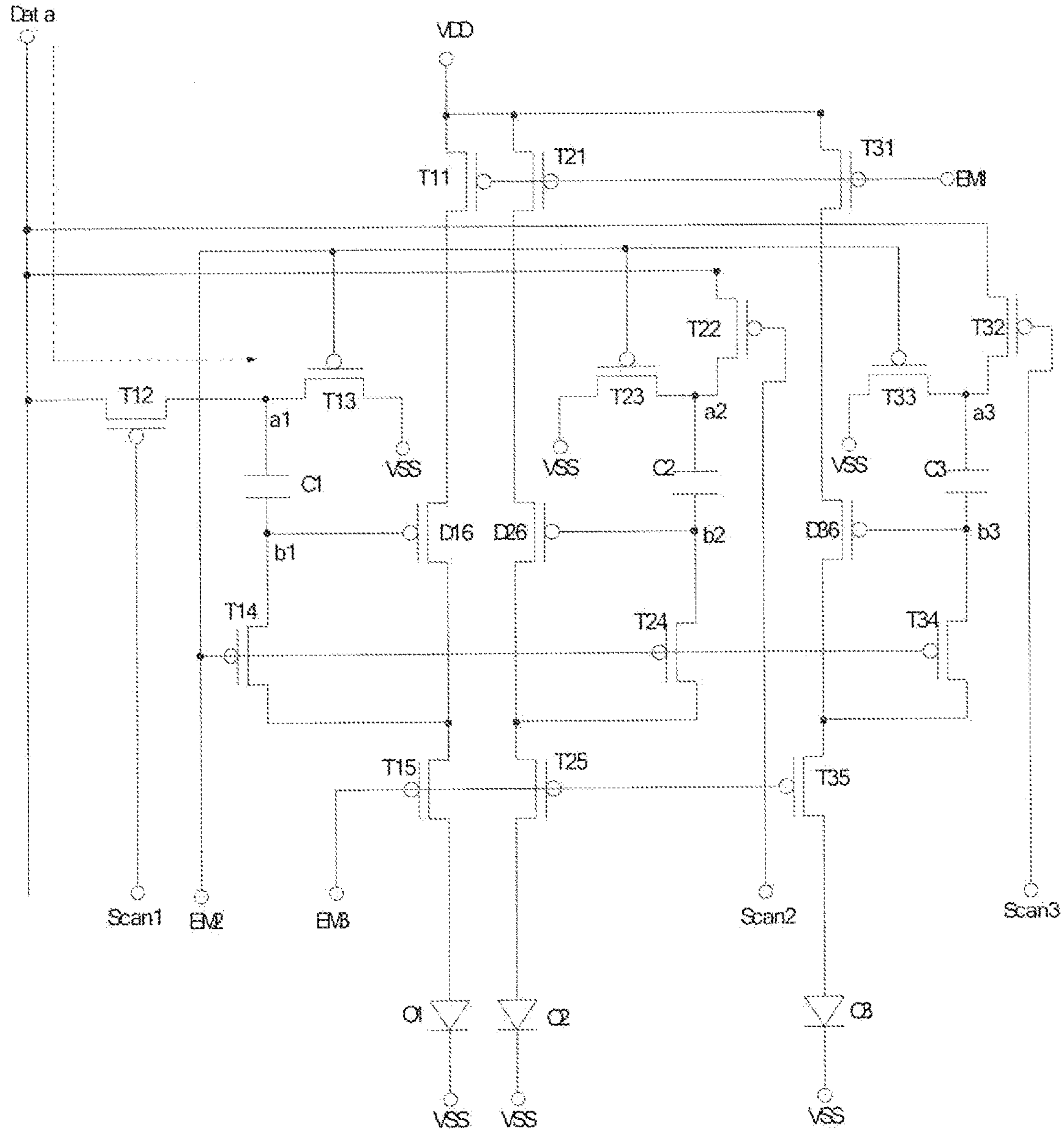
FIG. 21 is a schematic diagram of flow direction of current at phase w2 in the pixel circuit as provided in FIG. 18 of the present disclosure.

At the first pixel compensation phase w2, Scan1 is at the low voltage level, Scan2, Scan3, EM1, EM2 and EM3 are at the high voltage level, and the voltage level of the data line is V1. The TFT T12 is turned on, and the other TFTs are turned off. Now the potential at point a1 is changed from 0V to V1 while point b1 is floated, and thus in order to remain the original voltage difference (VDD−Vth1) between points a1 and b1, the potential at the gate b1 of DI 6 would jump with the same voltage difference. The potential at point b1 jumps to VDD−Vth1+V1. FIG. 21 shows the flow path of the current in the first pixel compensation phase.

Figure 22:
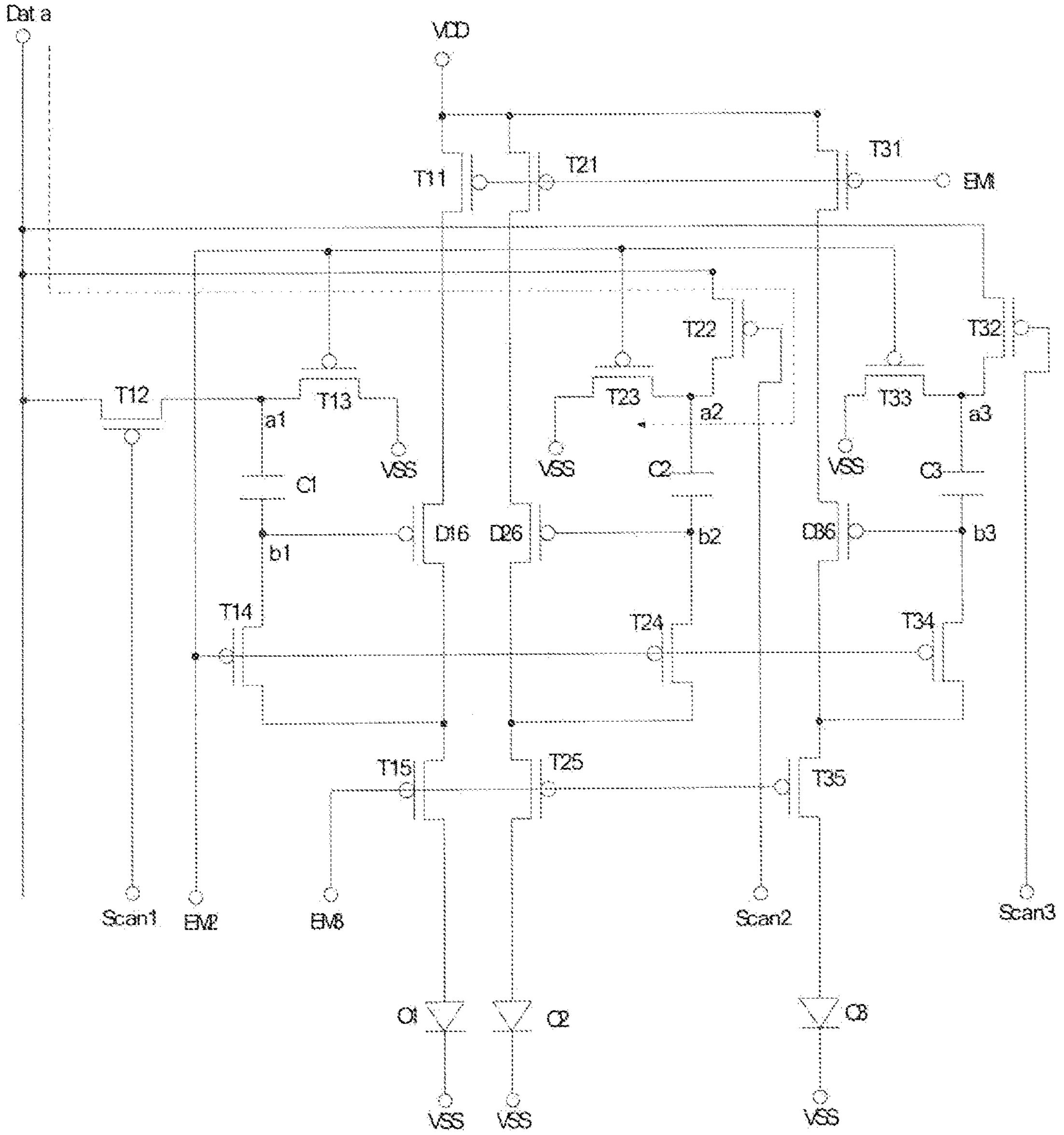
FIG. 22 is a schematic diagram of flow direction of current at phase w3 in the pixel circuit as provided in FIG. 18 of the present disclosure.

At the second pixel compensation phase w3, Scan2 is at the low voltage level, Scan1, Scan3, EM1, EM2 and EM3 are at the high voltage level, and the voltage level of the data line is V2. The TFT T22 is turned on, and the other TFTs are turned off. Now the potential at point a2 is changed from 0V to V2 while point b2 is floated, and thus in order to remain the original voltage difference (VDD−Vth2) between points a2 and b2, the potential at the gate b2 of D26 would jump with the same voltage difference. The potential at point b2 jumps to VDD−Vth2+V2. FIG. 22 shows the flow path of the current in the second pixel compensation phase.

Figure 23:
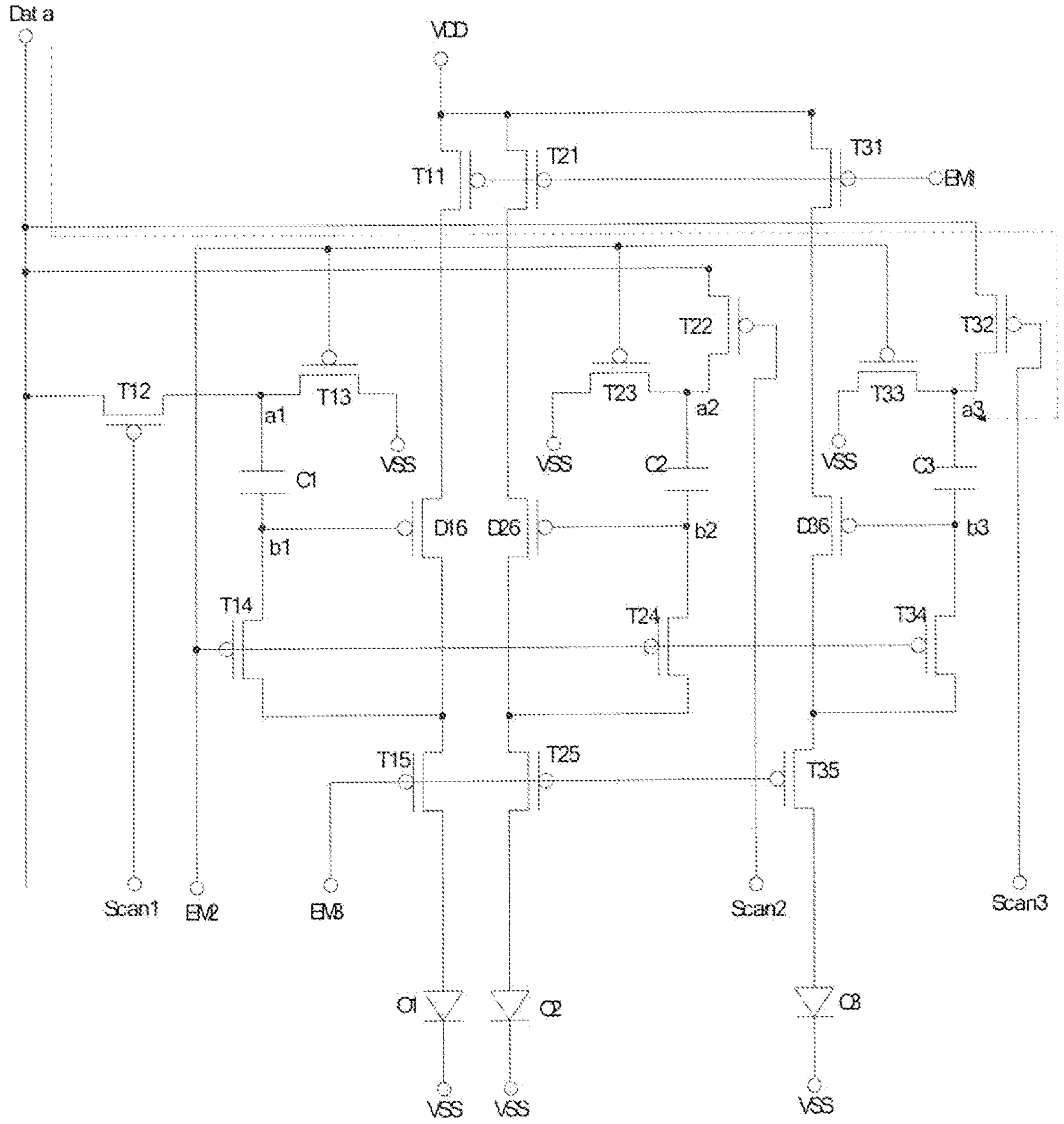
FIG. 23 is a schematic diagram of flow direction of current at phase w4 in the pixel circuit as provided in FIG. 18 of the present disclosure.

At the third pixel compensation phase w4, Scan3 is at the low voltage level, Scan1, Scan2, EM1, EM2 and EM3 are at the high voltage level, and the voltage level of the data line is V3. The TFT T32 is turned on, and the other TFTs are turned off. Now the potential at point a3 is changed from 0V to V3 while point b3 is floated, and thus in order to remain the original voltage difference (VDD−Vth3) between points a3 and b3, the potential at the gate b3 of D36 would jump with the same voltage difference. The potential at point b3 jumps to VDD−Vth3+V3. FIG. 23 shows the flow path of the current in the third pixel compensation phase.

At the light emitting phase w5 which is the actual light emitting phase of the electroluminescent units O1, O2 and O3, EM1 and EM3 are at the low voltage level, and Scan1, Scan2, Scan3 and EM2 are all at the high voltage level. The TFTs T11, T21, T31, T15, T25 and T35 are turned on, and the other TFTs are turned off.

Figure 24:
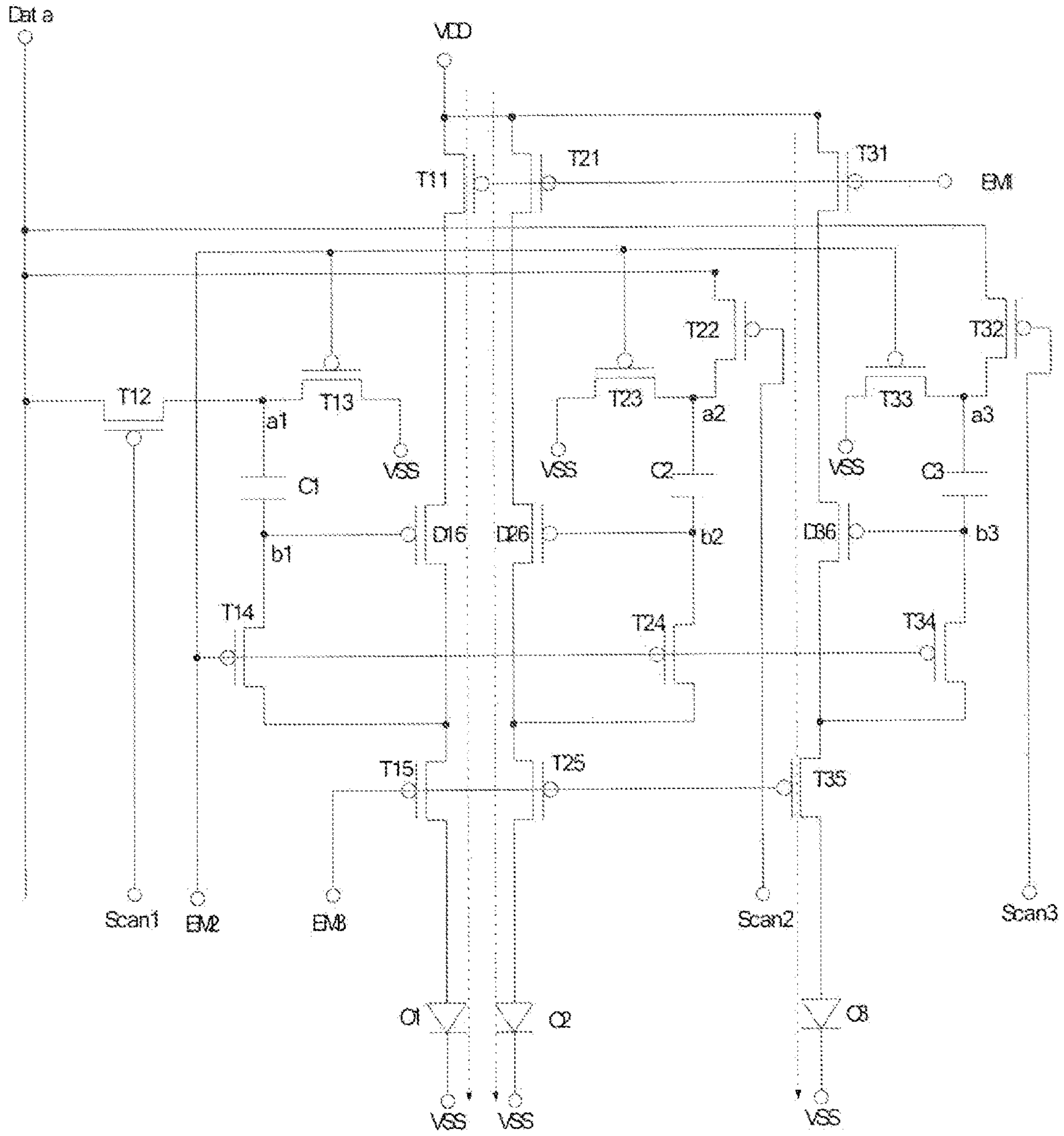
FIG. 24 is a schematic diagram of flow direction of current at phase w5 in the pixel circuit as provided in FIG. 18 of the present disclosure.

The three sub-pixel circuits are input with the high voltage level VDD of the first voltage terminal VA while the capacitors C1, C2 and C3 all remain the original voltage difference1s. The potential at point b1 is VDD−Vth1+V1, the potential at point b2 is VDD−Vth2+V2, and the potential at point b3 is VDD−Vth3+V3. FIG. 24 shows the flow direction of the current in the circuit at this phase.

According to the saturation current equation, the current $I_{OLED}$ flowing in O1 is calculated by the following equation:

$$\begin{aligned} I_{OLED} &= K(V_{GS} - Vth1)^2 \\ &= K[VDD - (VDD - Vth1 - V1) - Vth1]^2 \\ &= K \cdot V1^2 \end{aligned}$$

wherein Vth1 is the threshold voltage of the driving unit D16, Vth2 is the threshold voltage of the driving unit D26, and Vth3 is the threshold voltage of the driving unit D36.

Similarly, the current flowing in O2 is $I_{OLED}=K\cdot V2^2$, the current flowing in O3 is $I_{OLED}=K\cdot V3^2$; $V_{GS}$ is the voltage between the gate and the source of the driving transistor, $$K = \mu C_{ox}\frac{W}{L},$$

μ and $C_{ox}$ are process constants, W is the width of the TFT channel, L is the length of the TFT channel. W and L are both constants that can be designed selectively.

It can be seen from the above equation that the operating current $I_{OLED}$ now is not influenced by the threshold voltage of the driving transistors but only related to the voltage (V1, V2 and V3) on the data line Data, which completely solves the problem that the threshold voltage (Vth) drift of the driving transistors due to the process and low time operation influences the operating current lot), eliminates the influence of the threshold voltage to $I_{OLED}$, and ensures the normal operation of the OLED.

Figure 25:
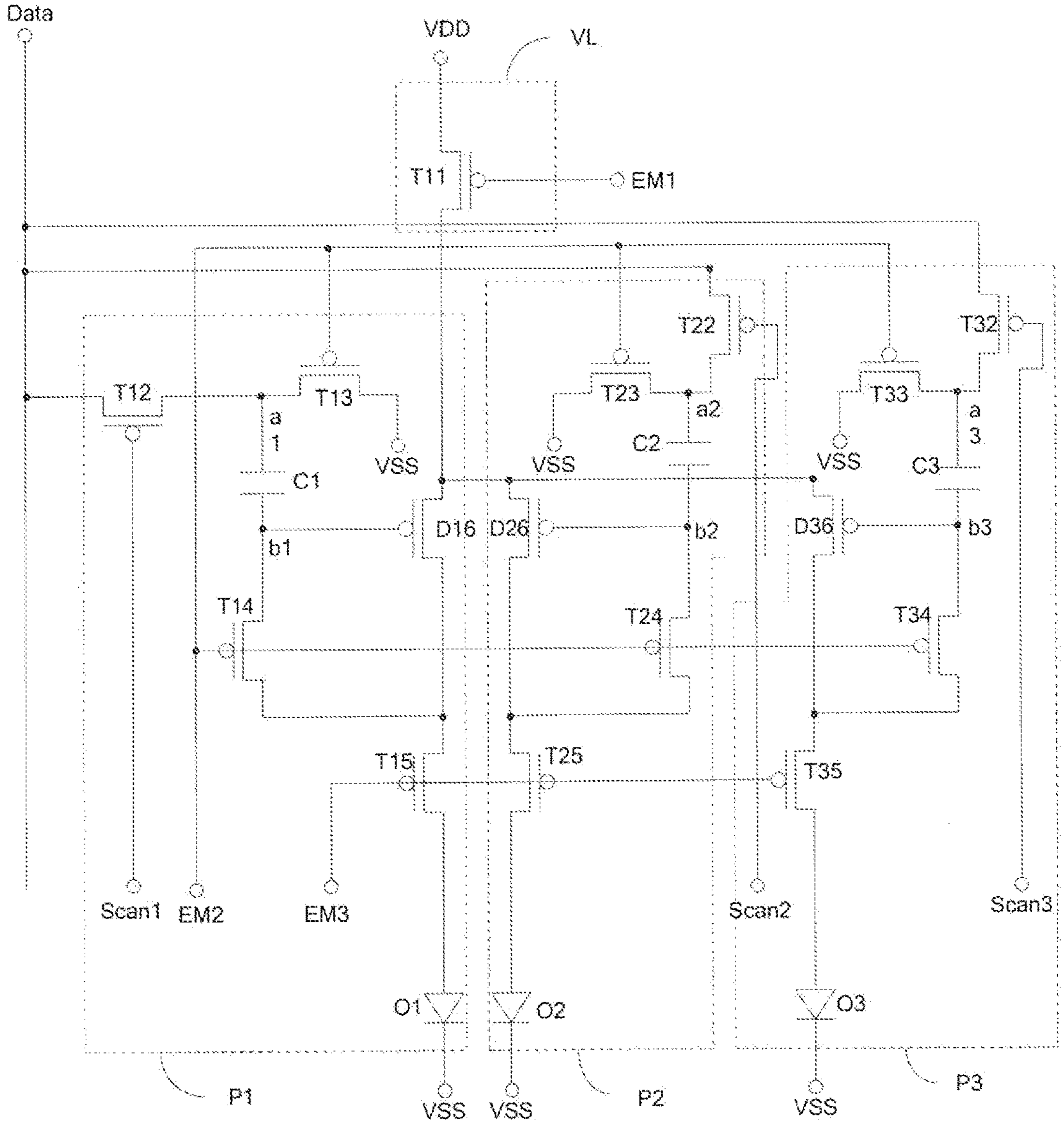
FIG. 25 is a schematic diagram of a structure of a pixel circuit provided by yet another embodiment of the present disclosure.

Further, the power supply circuit VL can only comprise one switch unit, i.e., the first switch unit T11. The control terminal of T11 is connected to the first signal control line EM1, the first terminal of T11 is connected to the first voltage level terminal VA, and the second terminal of T11 is connected to the three sub-pixel circuits, and the first switch unit T11 is configured to provide the first voltage level of the first voltage level terminal VA to the three sub-pixel circuits under the control of the signal of the first signal control line EM1. FIG. 25 is a schematic diagram of a structure of a pixel circuit provided by another embodiment of the present disclosure. As shown in FIG. 25, the power supply circuit VL now comprises only one TFT, which further reduces the wiring complexity of the circuit and reduces the cost of the integrated circuit. Reducing the number of the TFT devices in such a manner can dramatically reduce the sub-pixel size and decrease the IC cost, and thus obtain a higher picture quality.

In the pixel circuit provided by the embodiment of the present disclosure, three adjacent sub-pixel circuits share one data line, and one first voltage level terminal is configured to supply operating voltages to the three sub-pixel circuits. Therefore, it is possible to decrease the number of the signal lines used in the pixel circuit in the display apparatus, reduce the cost of the integrated circuit, and improve the pixel density of the display apparatus. At the same time, the operating current flowing through the electroluminescent unit is not influenced by the threshold voltage of the corresponding driving transistor, which completely solves the problem of nonuniformity of display brightness due to threshold voltage drift of the driving transistor.

An embodiment of the present disclosure provides a display apparatus comprising any one of the above pixel circuits.

Figure 26:
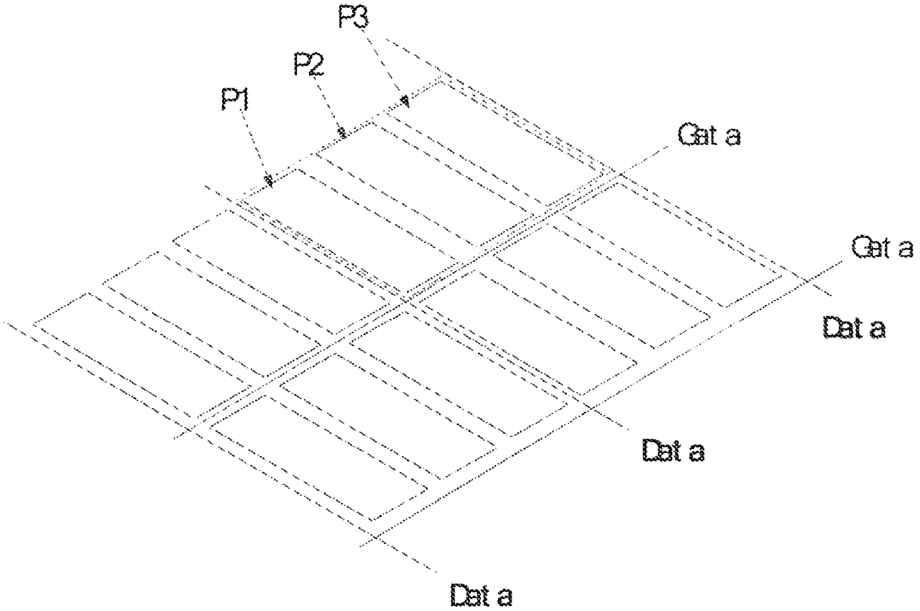
FIG. 26 is a schematic diagram of a positional relation between pixel circuits and pixels in a display apparatus provided in an embodiment of the present disclosure.
Figure 27:
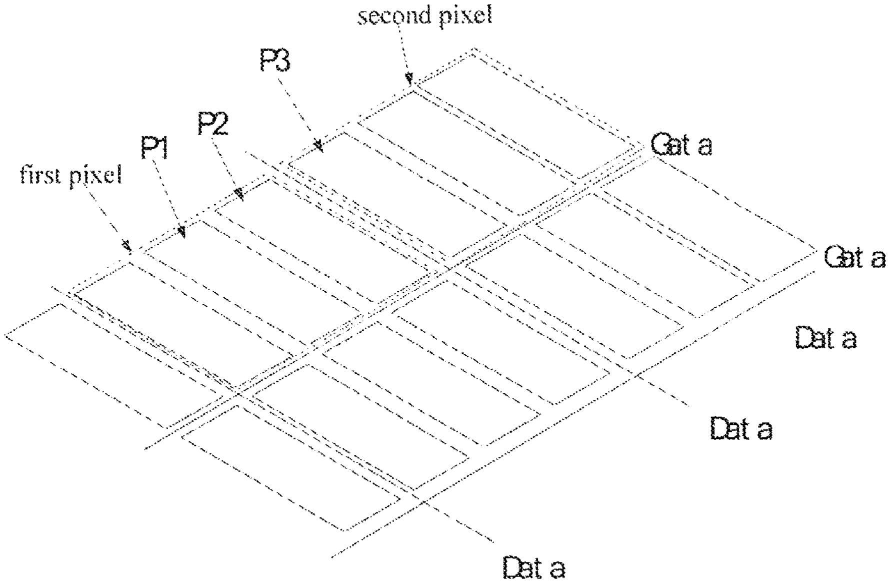
FIG. 27 is a schematic diagram of a positional relation between pixel circuits and pixels in a display apparatus provided in an embodiment of the present disclosure.
Figure 28:
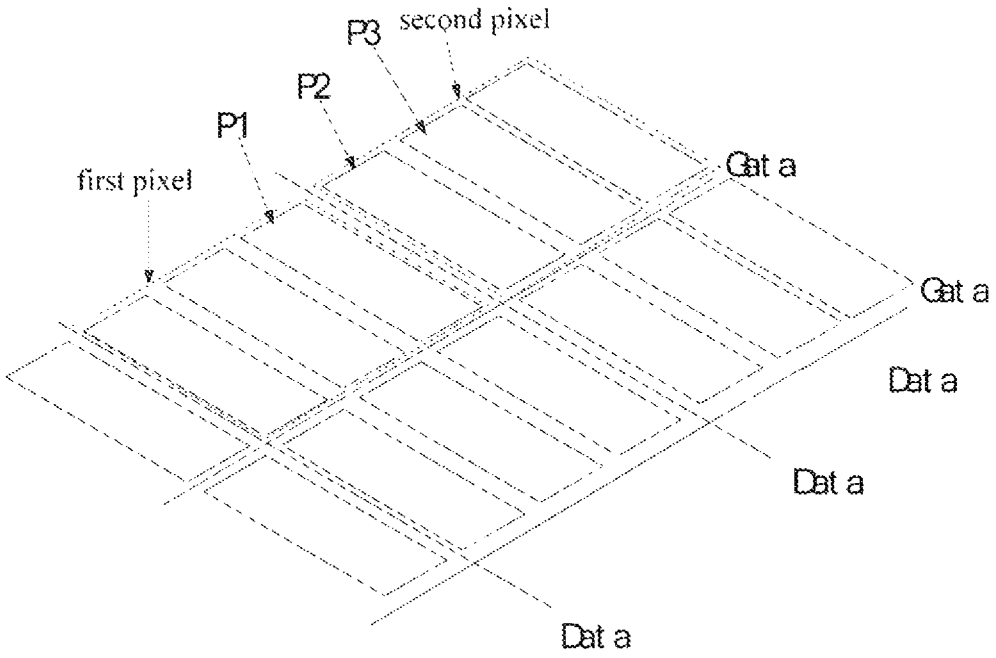
FIG. 28 is a schematic diagram of a positional relation between pixel circuits and pixels in a display apparatus provided in an embodiment of the present disclosure.

FIGS. 26-28 are schematic diagrams of positional relationship between the pixel circuits and the pixels in a display apparatus provided by embodiments of the present disclosure, respectively. Optionally, the three sub-pixel circuits are located on the same side of the data line. As shown in FIG. 26, the sub-pixel circuit P1, the sub-pixel circuit P2 and the sub-pixel circuit P3 are located on the same side of the data line Data, that is, located between two data lines Data, wherein P1, P2 and P3 constitute one pixel circuit.

Optionally, as shown in FIG. 27, the three sub-pixel circuits of the pixel circuit are located within two adjacent pixels, a first sub-pixel circuit and a second sub-pixel circuit which are adjacent among the three sub-pixel circuits are located within a first pixel, and a third sub-pixel circuit is located within a second pixel. As shown in FIG. 27, the sub-pixel circuit P1 and the sub-pixel circuit P2 are located within the first pixel, and the sub-pixel circuit P3 is located within the second pixel.

Optionally, as shown in FIG. 28, a first sub-pixel circuit among the three sub-pixel circuits is located within a first pixel, and a second sub-pixel circuit and a third sub-pixel circuit which are adjacent are located within a second pixel.

The first pixel is adjacent to the second pixel. As shown in FIG. 28, the sub-pixel circuit P1 is located within the first pixel, and the sub-pixel circuit P2 and the sub-pixel circuit P3 are located within the second pixel. Referring to FIG. 27 and FIG. 28, the data line Data is located between the first pixel and the second pixel. As such, it is possible to make the distribution of devices on a corresponding substrate more uniform. The above FIGS. 26, 27 and 28 also show gate lines Gata crossing the data lines Data.

The display apparatus can be any product or component with display function, such as electronic paper, a cell phone, a tablet, a television, a display, a notebook computer, a digital photo frame, a navigator or the like.

The above descriptions are only specific implementations of the present disclosure, but the protection scope of the present disclosure is not limited to this. Changes or replacements that can be easily devised by those skilled in the art within the technical scope of the present disclosure should all fall within the protection scope of the present disclosure. Therefore, the protection scope of the present disclosure should be defined by the protection scope of the claims.

The present application claims the priority of Chinese Patent Application No. 201410342198.1 filed on Jul. 17, 2014, entire content of which is incorporated as part of the present invention by reference.

What is claimed is:

1. A pixel circuit comprising three sub-pixel circuits and one power supply circuit, wherein the three sub-pixel circuits share a data line; the three sub-pixel circuits of the pixel circuit are located within the same pixel; and the three sub pixel circuits are located on the same side of the data line, the power supply circuit is connected to a first voltage level terminal, a first signal control line and the sub-pixel circuits, the power supply circuit is configured to supply a first voltage level to the sub-pixel circuits through the first voltage level terminal under the control of a signal of the first signal control line; and a first sub-pixel circuit, a second sub-pixel circuit, and a third sub-pixel circuit of the three sub-pixel circuits are connected to the power supply circuit and the data line, and are configured to display a gray scale under the control of the first voltage level supplied by the power supply circuit and a data signal of the data line, respectively;

wherein each of the three sub-pixel circuits comprises a first switch unit, wherein a first terminal of the first switch unit in the first sub-pixel circuit, a first terminal of the first switch unit in the second sub-pixel circuit, and a first terminal of the first switch unit in the third sub-pixel circuit are all connected to the data line, and wherein a control terminal of the first switch unit in the first sub-pixel circuit, a control terminal of the first switch unit in the second sub-pixel circuit, and a control terminal of the first switch unit in the third sub-pixel circuit are connected to a first scan signal line, a second scan signal line, and a third scan signal line, respectively; and wherein each of the three sub-pixel circuits further comprises an electroluminescent unit, a second switch unit, a sixth switch unit, a seventh switch unit, a driving unit, and an energy storage unit, wherein a control terminal of the second switch unit is connected with the second scan signal line, a first terminal of the second switch unit is connected directly with a first electrode of the electroluminescent unit, and both a second terminal of the second switch unit and a second electrode of the electroluminescent unit are connected directly a second voltage level terminal, a control terminal of the sixth switch unit is connected to the first scan signal line, a first terminal of the sixth switch unit is connected to the second voltage level terminal, a second terminal of the sixth switch unit is connected to a first electrode of the energy storage unit, and the sixth switch unit is configured to write a signal of the second voltage level terminal into the first electrode of the energy storage unit under the control of a signal from the first scan signal line, a control terminal of the seventh switch unit is connected to the second scan signal line, a first terminal of the seventh switch unit is connected to the first electrode of the energy storage unit, a second terminal of the seventh switch unit is connected to the second terminal of the first switch unit, and the seventh switch unit is configured to write the signal of the data line into the first electrode of the energy storage unit under the control of a signal from the second scan signal line, so as to coupling raise the voltage level of a second electrode of the energy storage unit, a control terminal of the driving unit is connected to the second terminal of the seventh switch unit, an input terminal of the driving unit is connected to the second electrode of the energy storage unit, an output terminal of the driving unit is connected to the first electrode of the electroluminescent unit, and the driving unit is configured to output a driving current, and the second electrode of the energy Storage unit is connected to the power supply circuit, and the energy storage unit is configured to store the signal of the data line and a threshold voltage of the driving unit.

2. The pixel circuit according to claim 1, wherein the power supply unit comprises three switch units whose control terminals are connected to the first signal control line, whose first terminals are connected to the first voltage level terminal, and whose second terminals are connected to the three sub-pixel circuits, and the three switch units is configured to supply the first voltage level of the first voltage level terminal to the three sub-pixel circuits under the control of a signal of the first signal control line.

3. The pixel circuit according to claim 1, wherein the power supply circuit comprises a third switch unit, a fourth switch unit and a fifth switch unit;

a control terminal of the third switch unit is connected to the first signal control line, a first terminal of the third switch unit is connected to the first voltage level terminal, and a second terminal of the third switch unit is connected to a first sub-pixel circuit among the three sub-pixel circuits, and the third switch unit is configured to supply the first voltage level of the first voltage level terminal to the first sub-pixel circuit under the control of the signal of the first signal control line;

a control terminal of the fourth switch unit is connected to the first signal control line, a first terminal of the fourth switch unit is connected to the first voltage level terminal, a second terminal of the fourth switch unit is connected to a second sub-pixel circuit among the three sub-pixel circuits, and the fourth switch unit is configured to supply the first voltage level of the first voltage level terminal to the second sub-pixel circuit under the control of the signal of the first signal control line; and a control terminal of the fifth switch unit is connected to the first signal control line, a first terminal of the fifth switch unit is connected to the first voltage level terminal, a second terminal of the fifth switch unit is connected to a third sub-pixel circuit among the three sub-pixel circuits, and the fifth switch unit is configured to supply the first voltage level of the first voltage level terminal to the third sub-pixel circuit under the control of the signal of the first signal control line.

4. A display apparatus comprising a pixel circuit according to claim 1.

5. The pixel circuit according to claim 1, wherein the switch units and the driving unit are TFTs, the control terminal of each switch unit is a gate of a TFT, the first terminal of the each switch unit is a source of a TFT, the second terminal of each switch unit is a drain of a TFT, the input terminal of the driving unit is a source of a TFT, the control terminal of the driving unit is a gate of a TFT, and the output terminal of the driving unit is a drain of a TFT.

6. The pixel circuit according to claim 1, wherein the energy storage unit is a capacitor.

7. The pixel circuit according to claim 1, wherein the electroluminescent unit is an organic light emitting diode.

* * * * *